(12) United States Patent
Yu et al.

(10) Patent No.: US 10,797,038 B2
(45) Date of Patent: Oct. 6, 2020

(54) SEMICONDUCTOR PACKAGE AND REWORK PROCESS FOR THE SAME

(71) Applicant: Taiwan Semiconductor Manufacturing Company, Ltd., Hsin-Chu (TW)

(72) Inventors: Chen-Hua Yu, Hsin-Chu (TW); An-Jhih Su, Bade (TW); Shing-Chao Chen, Zhubei (TW); Ching-Hua Hsieh, Hsin-Chu (TW); Chung-Shi Liu, Hsin-Chu (TW); Der-Chyang Yeh, Hsin-Chu (TW); Ming-Da Cheng, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 51 days.

(21) Appl. No.: 15/053,795

(22) Filed: Feb. 25, 2016

(65) Prior Publication Data

US 2017/0250171 A1    Aug. 31, 2017

(51) Int. Cl.
| | |
|---|---|
| *H01L 25/00* | (2006.01) |
| *H01L 21/66* | (2006.01) |
| *H01L 23/00* | (2006.01) |
| *H01L 25/10* | (2006.01) |
| *H01L 25/16* | (2006.01) |
| *H01L 21/56* | (2006.01) |
| *H01L 23/31* | (2006.01) |

(52) U.S. Cl.
CPC ............ *H01L 25/50* (2013.01); *H01L 22/20* (2013.01); *H01L 24/19* (2013.01); *H01L 24/97* (2013.01); *H01L 24/98* (2013.01); *H01L 25/105* (2013.01); *H01L 25/16* (2013.01); *H01L 21/561* (2013.01); *H01L 22/12* (2013.01); *H01L 23/3128* (2013.01); *H01L 2224/04105* (2013.01); *H01L 2224/12105* (2013.01); *H01L 2224/32145* (2013.01); *H01L 2224/32225* (2013.01); *H01L 2224/48091* (2013.01); *H01L 2224/73265* (2013.01); *H01L 2224/73267* (2013.01); *H01L 2224/92244* (2013.01); *H01L 2224/97* (2013.01); *H01L 2225/0651* (2013.01); *H01L 2225/06568* (2013.01); *H01L 2225/1035* (2013.01); *H01L 2225/1058* (2013.01); *H01L 2924/15311* (2013.01)

(58) Field of Classification Search
None
See application file for complete search history.

(56) References Cited

U.S. PATENT DOCUMENTS

| | | | |
|---|---|---|---|
| 3,735,911 A | * | 5/1973 Ward | H01L 24/75 228/119 |
| 4,278,867 A | * | 7/1981 Tan | B23K 1/0056 148/DIG. 93 |

(Continued)

*Primary Examiner* — Cory W Eskridge
(74) *Attorney, Agent, or Firm* — Slater Matsil, LLP

(57) ABSTRACT

An embodiment is a method including bonding a first package to a first set of conductive pads of a second package with a first set of solder joints, testing the first package for defects, heating the first set of solder joints by directing a laser beam at a surface of the first package based on testing the first package for defects, after the first set of solder joints are heated, removing the first package, and bonding a third package to the first set of conductive pads of the second package.

20 Claims, 28 Drawing Sheets

(56) References Cited

U.S. PATENT DOCUMENTS

| | | | |
|---|---|---|---|
| 6,475,830 B1* | 11/2002 | Brillhart | H01L 22/20 |
| | | | 257/724 |
| 8,361,842 B2 | 1/2013 | Yu et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 2006/0076388 A1* | 4/2006 | Sato | B23K 1/018 |
| | | | 228/102 |
| 2009/0008762 A1* | 1/2009 | Jung | H01L 24/24 |
| | | | 257/686 |
| 2011/0024888 A1* | 2/2011 | Pagaila | H01L 23/13 |
| | | | 257/686 |
| 2011/0291288 A1 | 12/2011 | Wu et al. | |
| 2012/0193789 A1* | 8/2012 | Hu | H01L 21/56 |
| | | | 257/738 |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0307140 A1 | 11/2013 | Huang et al. | |
| 2014/0048906 A1* | 2/2014 | Shim | H01L 23/481 |
| | | | 257/531 |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2014/0346664 A1* | 11/2014 | Eppes | H01L 24/81 |
| | | | 257/737 |
| 2015/0001718 A1* | 1/2015 | Hatada | H01L 23/552 |
| | | | 257/741 |
| 2015/0179616 A1* | 6/2015 | Lin | H01L 25/50 |
| | | | 257/773 |
| 2017/0125374 A1* | 5/2017 | Lin | H01L 24/98 |

\* cited by examiner

SEMICONDUCTOR PACKAGE AND REWORK PROCESS FOR THE SAME

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

An example of these packaging technologies is the Package-on-Package (PoP) technology. In a PoP package, a top semiconductor packages is stacked on top of a bottom semiconductor package to allow high level of integration and component density. This high level of integration from PoP technology enables production of semiconductor devices with enhanced functionalities and small footprints on the printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
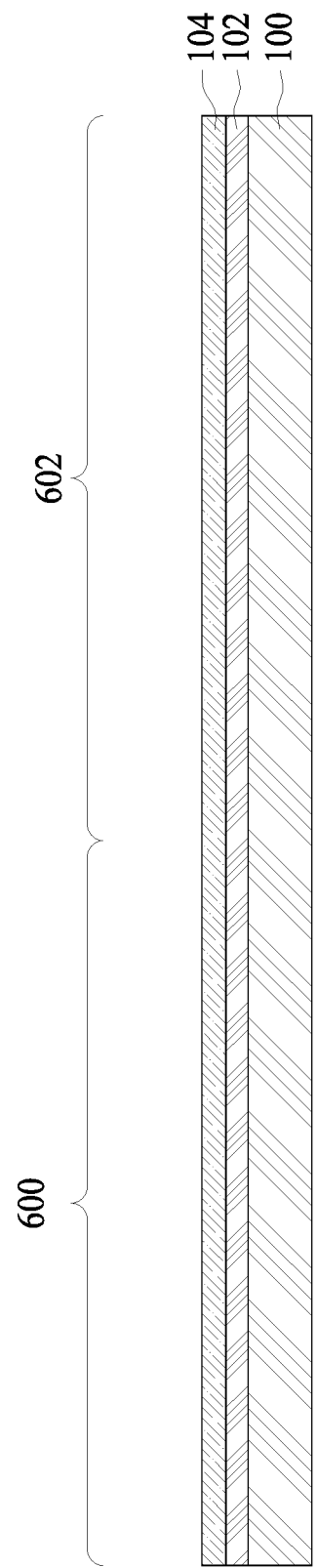
FIGS. 1 through 18 illustrate cross-sectional views of intermediate steps during a process for forming a first package structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package structure and rework processes and tool design for repairing semiconductor packages with integrated passive devices (IPDs). The package structures may include a fan-out or fan-in package. In particular, the package structures may include one or more IPDs. A wide variety of passive devices, such as baluns, couplers, splitters, filters, diplexers, capacitors, inductors, resistors, or the like can be integrated in an IPD device. Further, the teachings of this disclosure are applicable to any package structure including one or more integrated circuit dies with one or more IPDs. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the component may be sufficient to convey aspects of the embodiment. Further, method embodiments discussed herein may be discussed as being performed in a particular order; however, other method embodiments may be performed in any logical order.

FIGS. 1 through 18 illustrate cross-sectional views of intermediate steps during a process for forming a first package structure in accordance with some embodiments. FIG. 1 illustrates a carrier substrate 100 and a release layer 102 formed on the carrier substrate 100. A first package region 600 and a second package region 602 for the formation of a first package and a second package, respectively, are illustrated.

The carrier substrate 100 may be a glass carrier substrate, a ceramic carrier substrate, or the like. The carrier substrate 100 may be a wafer, such that multiple packages can be formed on the carrier substrate 100 simultaneously. The release layer 102 may be formed of a polymer-based material, which may be removed along with the carrier substrate 100 from the overlying structures that will be formed in subsequent steps. In some embodiments, the release layer 102 is an epoxy-based thermal-release material, which loses its adhesive property when heated, such as a Light-to-Heat-Conversion (LTHC) release coating. In other embodiments, the release layer 102 may be an ultra-violet (UV) glue, which loses its adhesive property when exposed to UV lights. The release layer 102 may be dispensed as a liquid and cured, may be a laminate film laminated onto the carrier substrate 100, or may be the like. The top surface of the release layer 102 may be leveled and may have a high degree of co-planarity.

Figure 2:
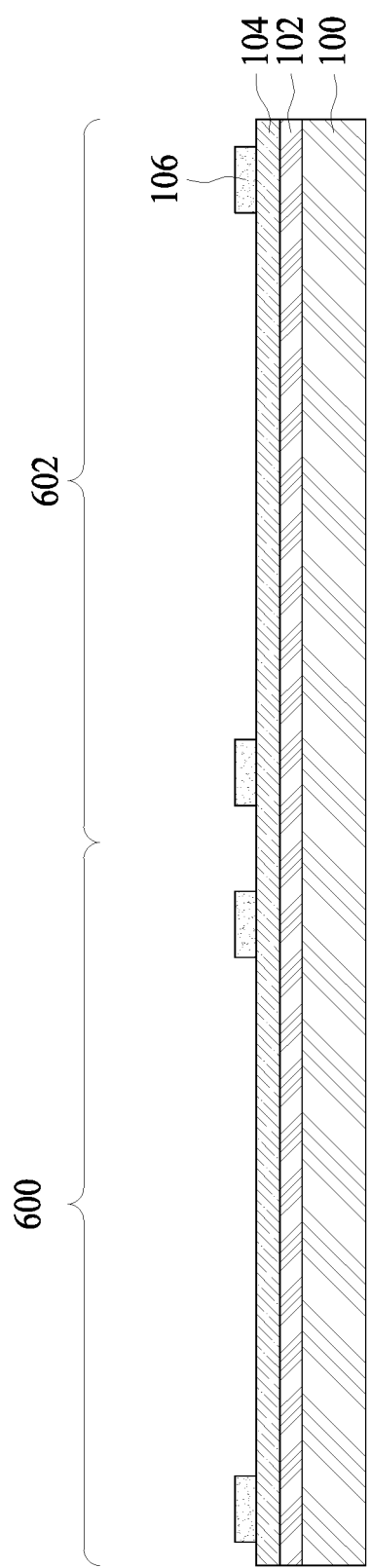

In FIG. 2, metallization patterns 106 are formed. As illustrated in FIG. 2, the dielectric layer 104 is formed on the release layer 102. The bottom surface of the dielectric layer 104 may be in contact with the top surface of the release layer 102. In some embodiments, the dielectric layer 104 is formed of a polymer, such as polybenzoxazole (PBO), polyimide, benzocyclobutene (BCB), or the like. In other embodiments, the dielectric layer 104 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 104 may be formed by any acceptable deposition process, such as spin coating, chemical vapor deposition (CVD), laminating, the like, or a combination thereof.

The metallization pattern 106 is formed on the dielectric layer 104. As an example to form metallization pattern 106, a seed layer (not shown) is formed over the dielectric layer 104. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 106. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 106.

Figure 3:
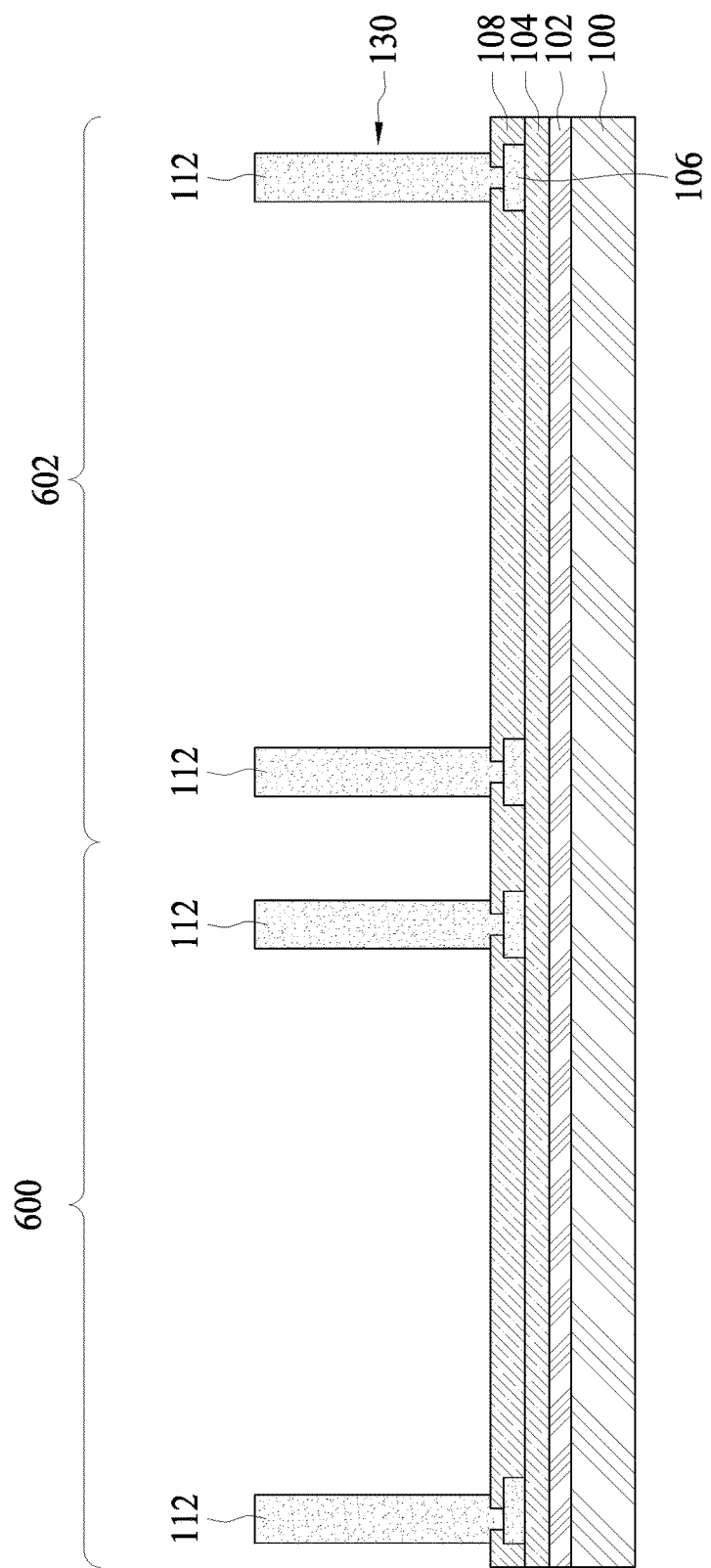

In FIG. 3, a dielectric layer 108 is formed on the metallization pattern 106 and the dielectric layer 104. In some embodiments, the dielectric layer 108 is formed of a polymer, which may be a photo-sensitive material such as PBO, polyimide, BCB, or the like, that may be patterned using a lithography mask. In other embodiments, the dielectric layer 108 is formed of a nitride such as silicon nitride; an oxide such as silicon oxide, PSG, BSG, BPSG; or the like. The dielectric layer 108 may be formed by spin coating, lamination, CVD, the like, or a combination thereof. The dielectric layer 108 is then patterned to form openings to expose portions of the metallization pattern 106. The patterning may be by an acceptable process, such as by exposing the dielectric layer 108 to light when the dielectric layer is a photo-sensitive material or by etching using, for example, an anisotropic etch.

The dielectric layers 104 and 108 and the metallization patterns 106 may be referred to as a back-side redistribution structure. As illustrated, the back-side redistribution structure includes the two dielectric layers 104 and 108 and one metallization pattern 106. In other embodiments, the back-side redistribution structure can include any number of dielectric layers, metallization patterns, and vias. One or more additional metallization pattern and dielectric layer may be formed in the back-side redistribution structure by repeating the processes for forming a metallization patterns 106 and dielectric layer 108. Vias may be formed during the formation of a metallization pattern by forming the seed layer and conductive material of the metallization pattern in the opening of the underlying dielectric layer. The vias may therefore interconnect and electrically couple the various metallization patterns.

Further in FIG. 3, through vias 112 are formed. As an example to form the through vias 112, a seed layer is formed over the back-side redistribution structure, e.g., the dielectric layer 108 and the exposed portions of the metallization pattern 106 as illustrated. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating or the like and may be exposed to light for patterning. The pattern of the photo resist corresponds to through vias. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form through vias 112.

Figure 4:
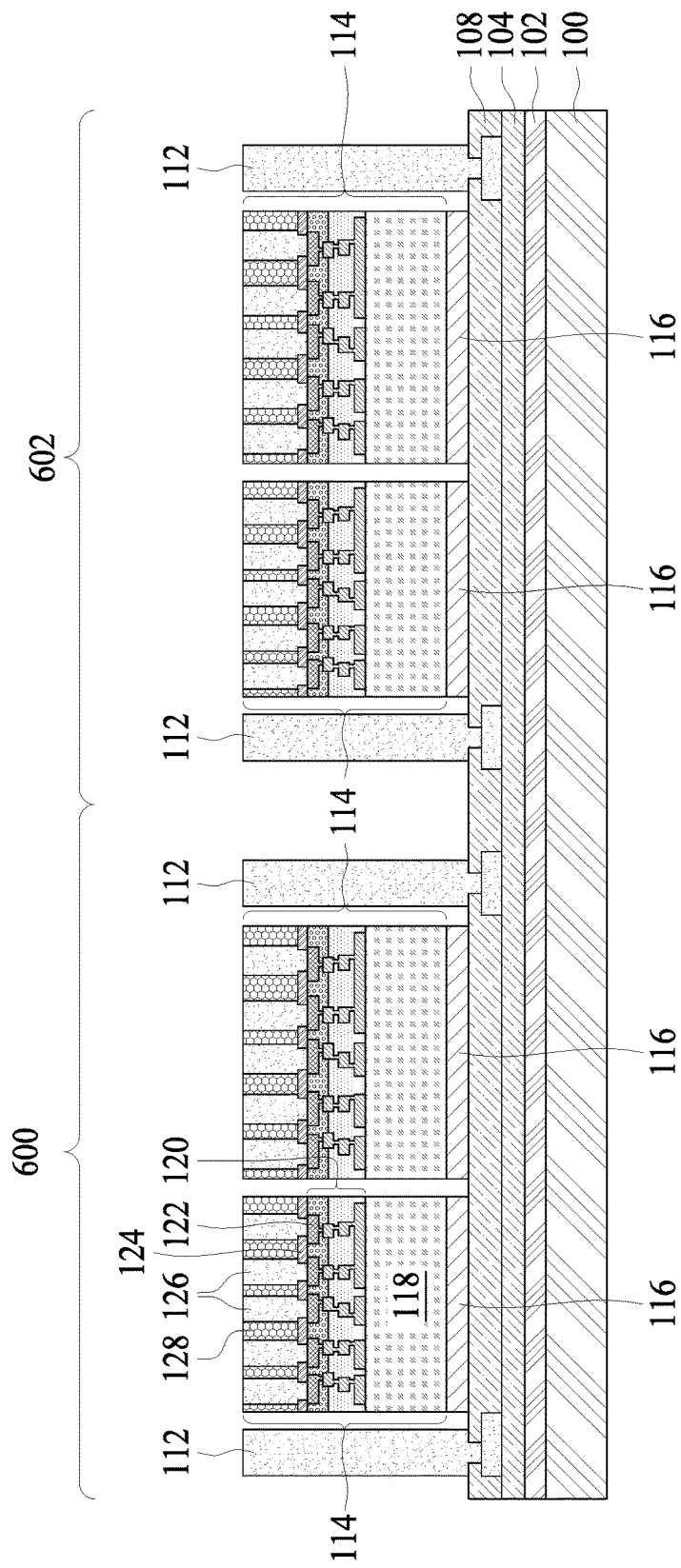

In FIG. 4, integrated circuit dies 114 are adhered to the dielectric layer 108 by an adhesive 116. As illustrated in FIG. 4, two integrated circuit dies 114 are adhered in each of the first package region 600 and the second package region 602, and in other embodiments, more or less integrated circuit dies may be adhered in each region. The integrated circuit dies 114 may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the integrated circuit dies 114 may be different sizes, and in other embodiments, the integrated circuit dies 114 may be the same size.

Before being adhered to the dielectric layer 108, the integrated circuit dies 114 may be processed according to applicable manufacturing processes to form integrated circuits in the integrated circuit dies 114. For example, the integrated circuit dies 114 each comprise a semiconductor substrate 118, such as silicon, doped or undoped, or an active layer of a semiconductor-on-insulator (SOI) substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 118 and may be interconnected by interconnect structures 120 formed by, for example, metallization patterns in one or more dielectric layers on the semiconductor substrate 118 to form an integrated circuit.

The integrated circuit dies 114 further comprise pads 122, such as aluminum pads, to which external connections are made. The pads 122 are on what may be referred to as respective active sides of the integrated circuit dies 114. Passivation films 124 are on the integrated circuit dies 114 and on portions of the pads 122. Openings are through the passivation films 124 to the pads 122. Die connectors 126, such as conductive pillars (for example, comprising a metal such as copper), are in the openings through passivation films 124 and are mechanically and electrically coupled to the respective pads 122. The die connectors 126 may be formed by, for example, plating, or the like. The die connectors 126 electrically couple the respective integrated circuits of the integrate circuit dies 114.

A dielectric material 128 is on the active sides of the integrated circuit dies 114, such as on the passivation films 124 and the die connectors 126. The dielectric material 128 laterally encapsulates the die connectors 126, and the dielectric material 128 is laterally co-terminus with the respective integrated circuit dies 114. The dielectric material 128 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

Adhesive 116 is on back-sides of the integrated circuit dies 114 and adheres the integrated circuit dies 114 to the back-side redistribution structure 110, such as the dielectric layer 108 in the illustration. The adhesive 116 may be any suitable adhesive, epoxy, die attach film (DAF), or the like. The adhesive 116 may be applied to a back-side of the integrated circuit dies 114, such as to a back-side of the respective semiconductor wafer or may be applied over the surface of the carrier substrate 100. The integrated circuit dies 114 may be singulated, such as by sawing or dicing, and adhered to the dielectric layer 108 by the adhesive 116 using, for example, a pick-and-place tool.

Figure 5:
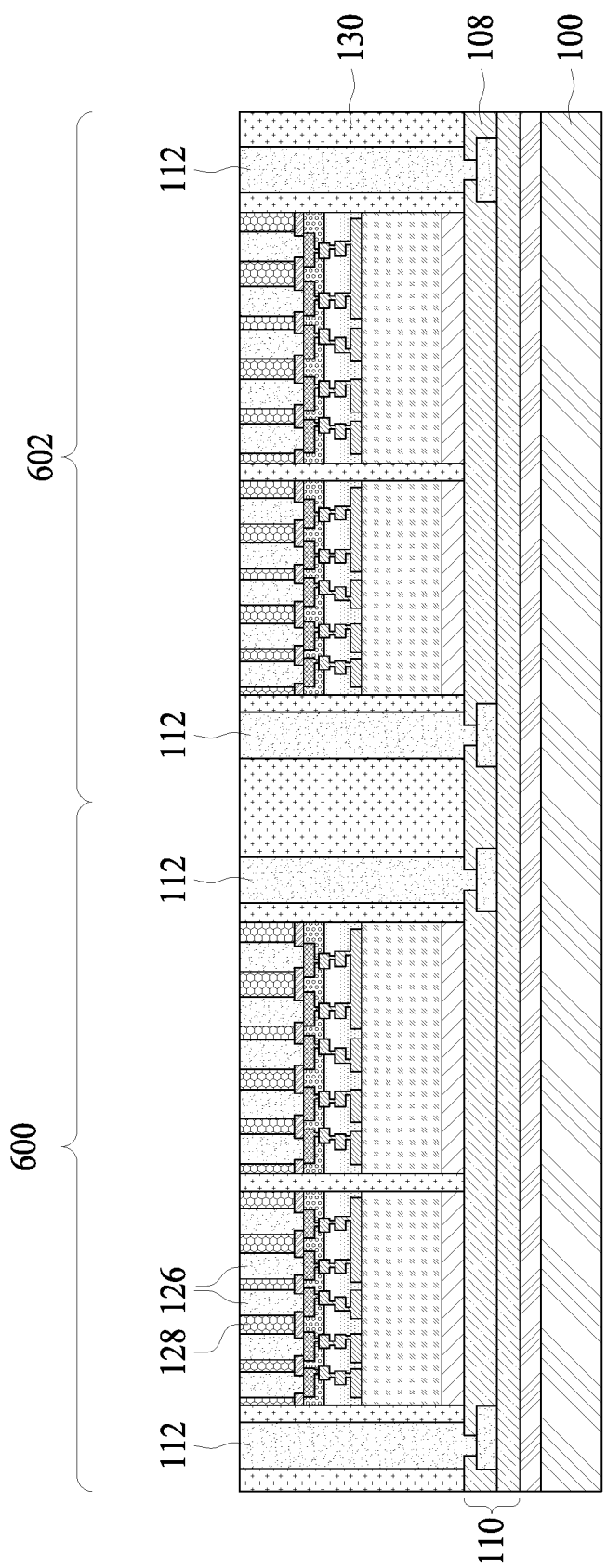

In FIG. 5, an encapsulant 130 is formed on the various components. The encapsulant 130 may be a molding compound, epoxy, or the like, and may be applied by compression molding, transfer molding, or the like. After curing, the encapsulant 130 can undergo a grinding process to expose the through vias 112 and die connectors 126. Top surfaces of the through vias 112, die connectors 126, and encapsulant 130 are co-planar after the grinding process. In some embodiments, the grinding may be omitted, for example, if through vias 112 and die connectors 126 are already exposed.

In FIGS. 6 through 16, a front-side redistribution structure 160 is formed. As will be illustrated in FIG. 16, the front-side redistribution structure 160 includes dielectric layers 132, 140, 148, and 156 and metallization patterns 138, 146, and 154.

Figure 6:
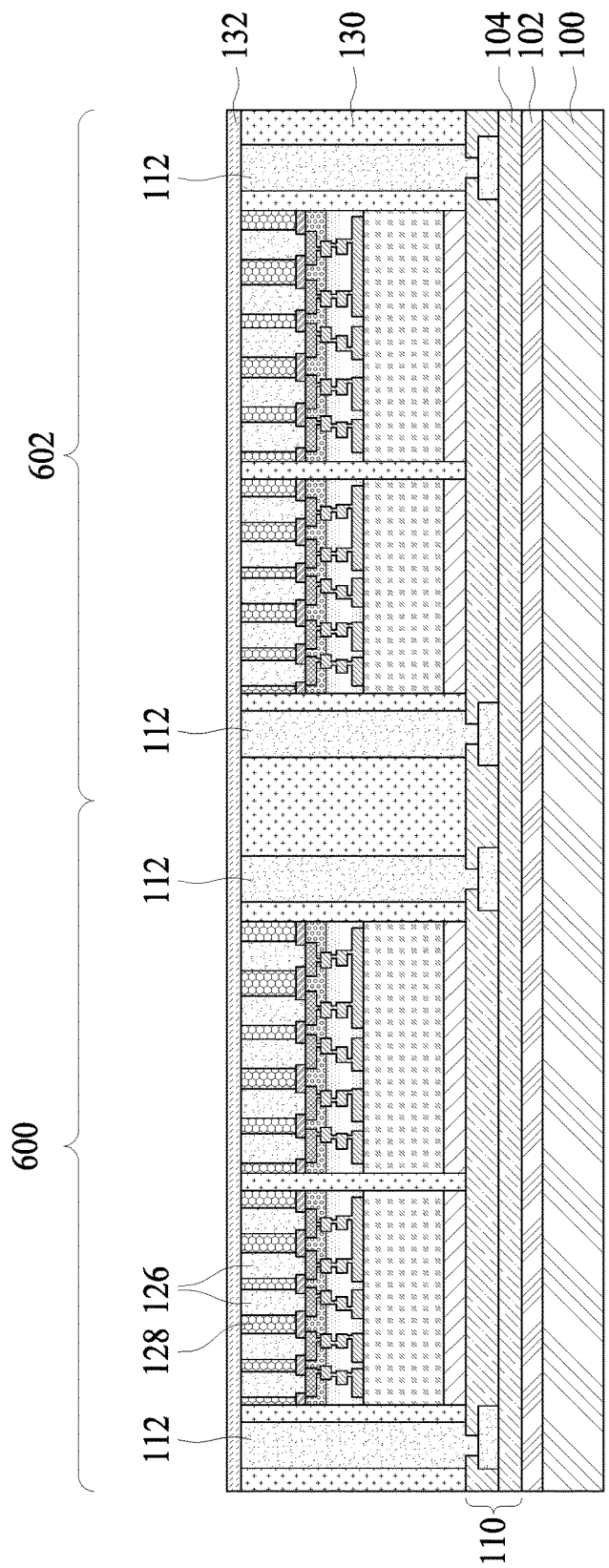

In FIG. 6, the dielectric layer 132 is deposited on the encapsulant 130, through vias 112, and die connectors 126. In some embodiments, the dielectric layer 132 is formed of a polymer, which may be a photo-sensitive material such as PBO, polyimide, BCB, or the like, that may be patterned using a lithography mask. In other embodiments, the dielectric layer 132 is formed of a nitride such as silicon nitride; an oxide such as silicon oxide, PSG, BSG, BPSG; or the like. The dielectric layer 132 may be formed by spin coating, lamination, CVD, the like, or a combination thereof.

Figure 7:
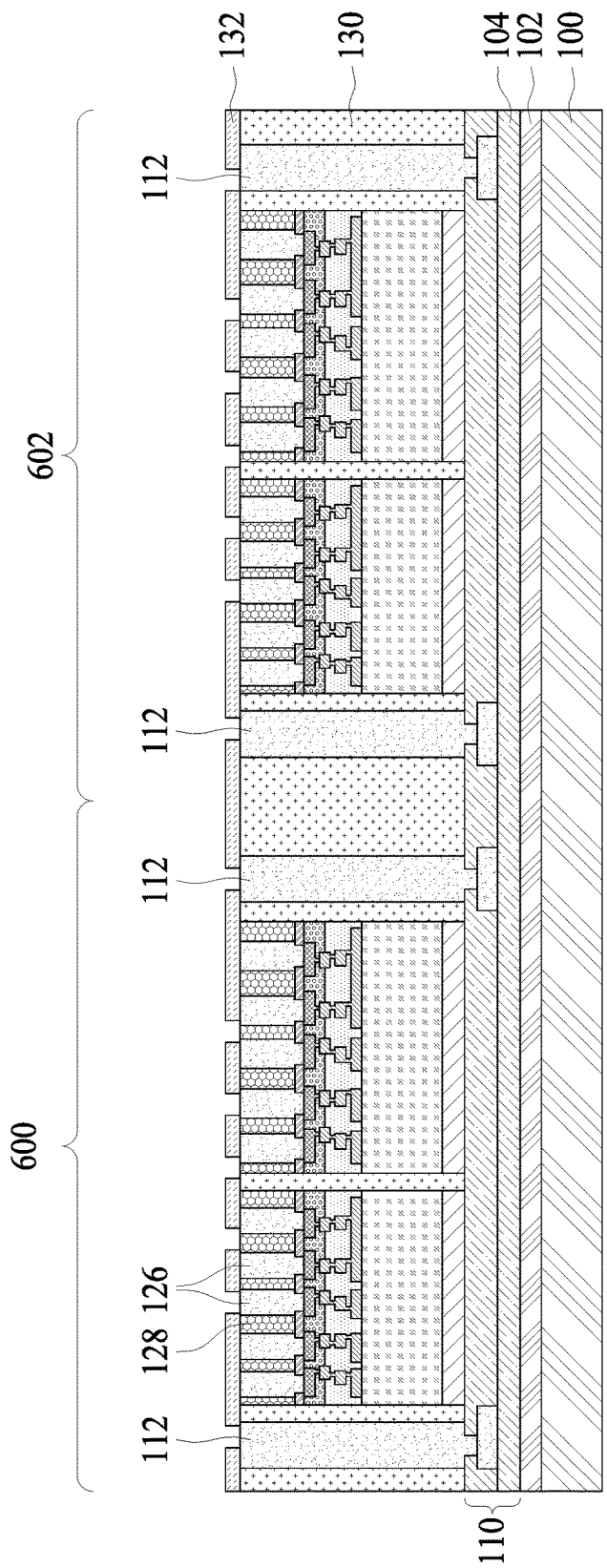

In FIG. 7, the dielectric layer 132 is then patterned. The patterning forms openings to expose portions of the through vias 112 and the die connectors 126. The patterning may be by an acceptable process, such as by exposing the dielectric layer 132 to light when the dielectric layer 132 is a photo-sensitive material or by etching using, for example, an anisotropic etch. If the dielectric layer 132 is a photo-sensitive material, the dielectric layer 132 can be developed after the exposure.

Figure 8:
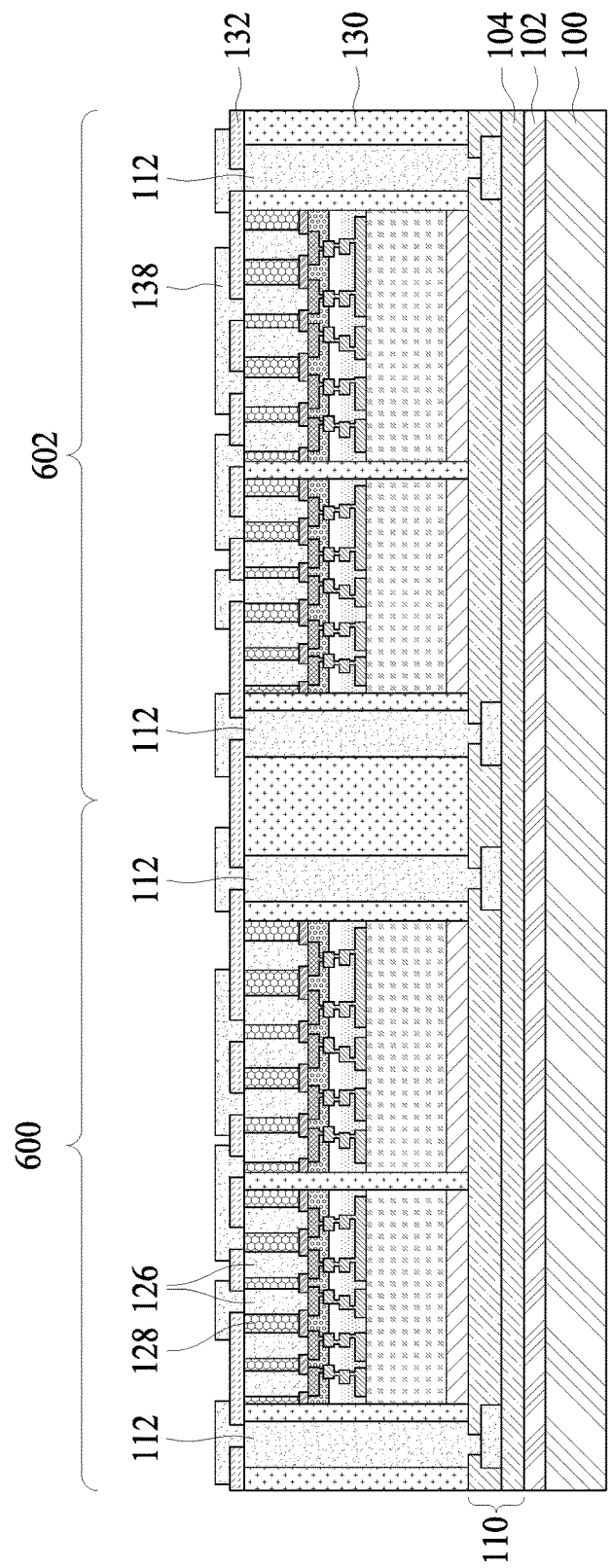

In FIG. 8, metallization pattern 138 with vias is formed on the dielectric layer 132. As an example to form metallization pattern 138, a seed layer (not shown) is formed over the dielectric layer 132 and in openings through the dielectric layer 132. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 138. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 138 and vias. The vias are formed in openings through the dielectric layer 132 to, e.g., the through vias 112 and/or the die connectors 126.

Figure 9:
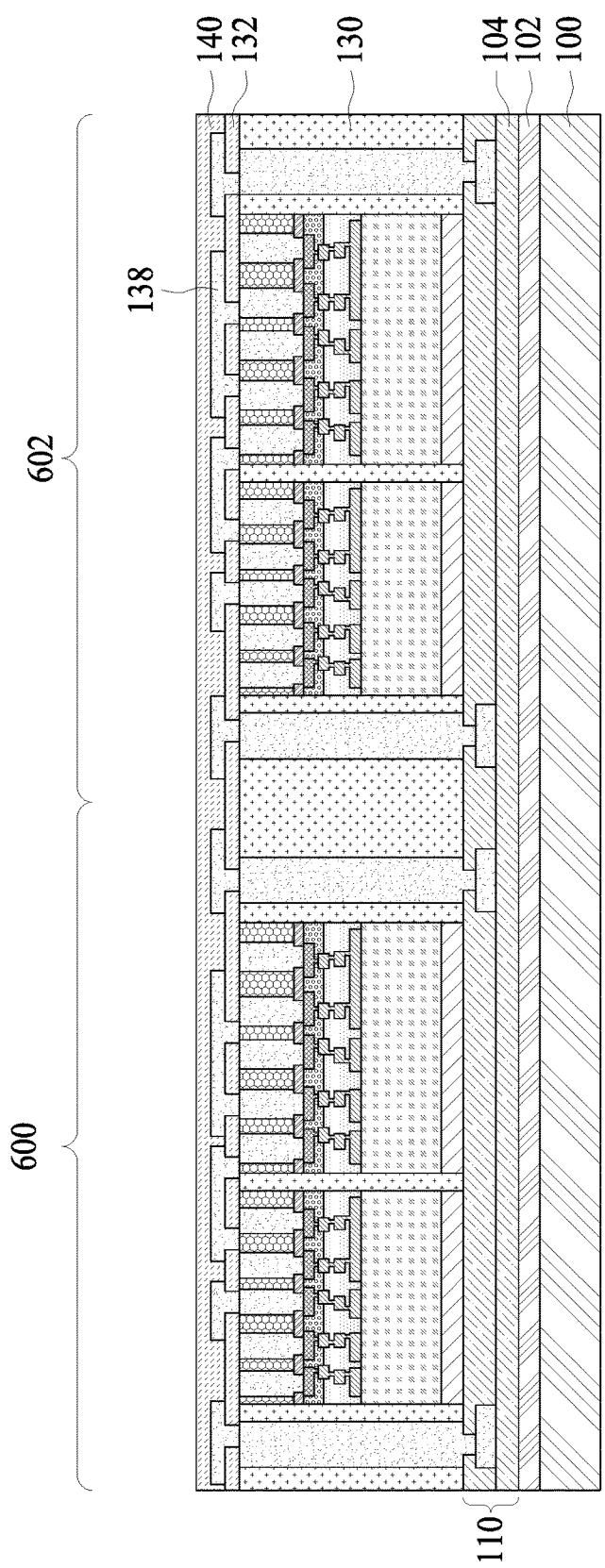

In FIG. 9, the dielectric layer 140 is deposited on the metallization pattern 138 and the dielectric layer 132. In some embodiments, the dielectric layer 140 is formed of a polymer, which may be a photo-sensitive material such as PBO, polyimide, BCB, or the like, that may be patterned using a lithography mask. In other embodiments, the dielectric layer 140 is formed of a nitride such as silicon nitride; an oxide such as silicon oxide, PSG, BSG, BPSG; or the like. The dielectric layer 140 may be formed by spin coating, lamination, CVD, the like, or a combination thereof.

Figure 10:
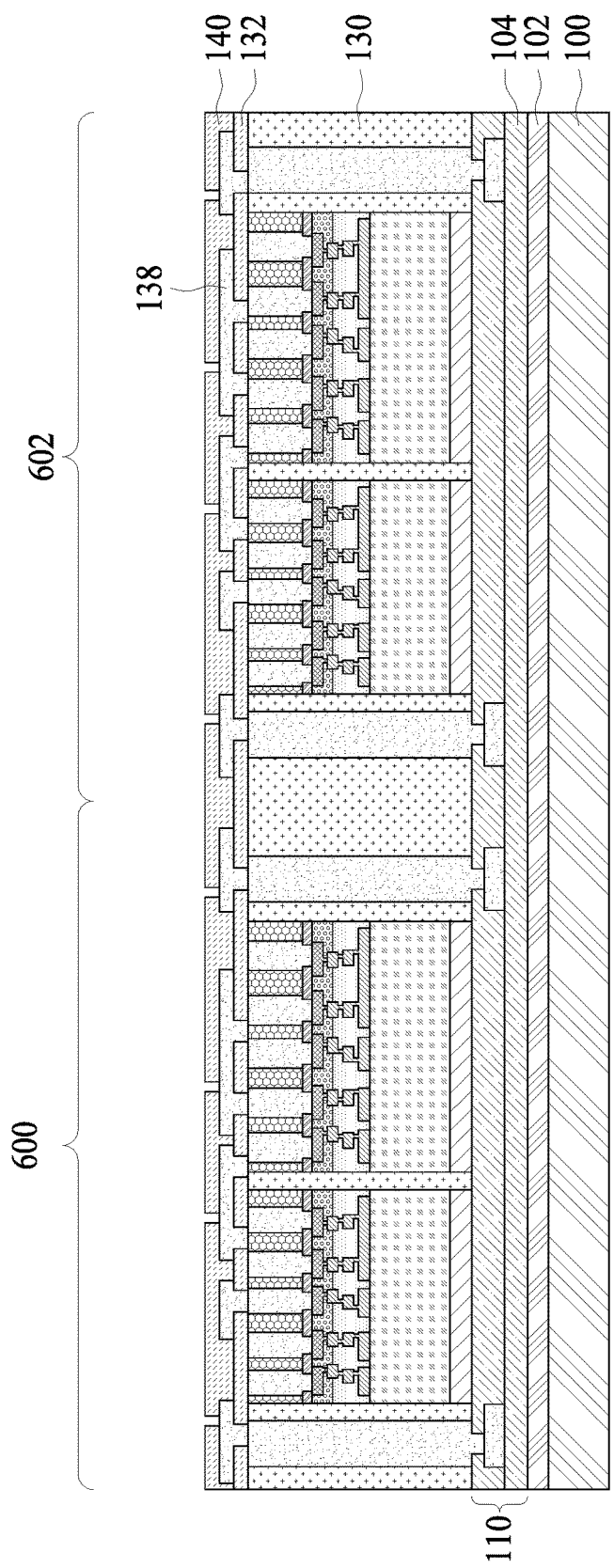

In FIG. 10, the dielectric layer 140 is then patterned. The patterning forms openings to expose portions of the metallization pattern 138. The patterning may be by an acceptable process, such as by exposing the dielectric layer 140 to light when the dielectric layer is a photo-sensitive material or by etching using, for example, an anisotropic etch. If the dielectric layer 140 is a photo-sensitive material, the dielectric layer 140 can be developed after the exposure.

Figure 11:
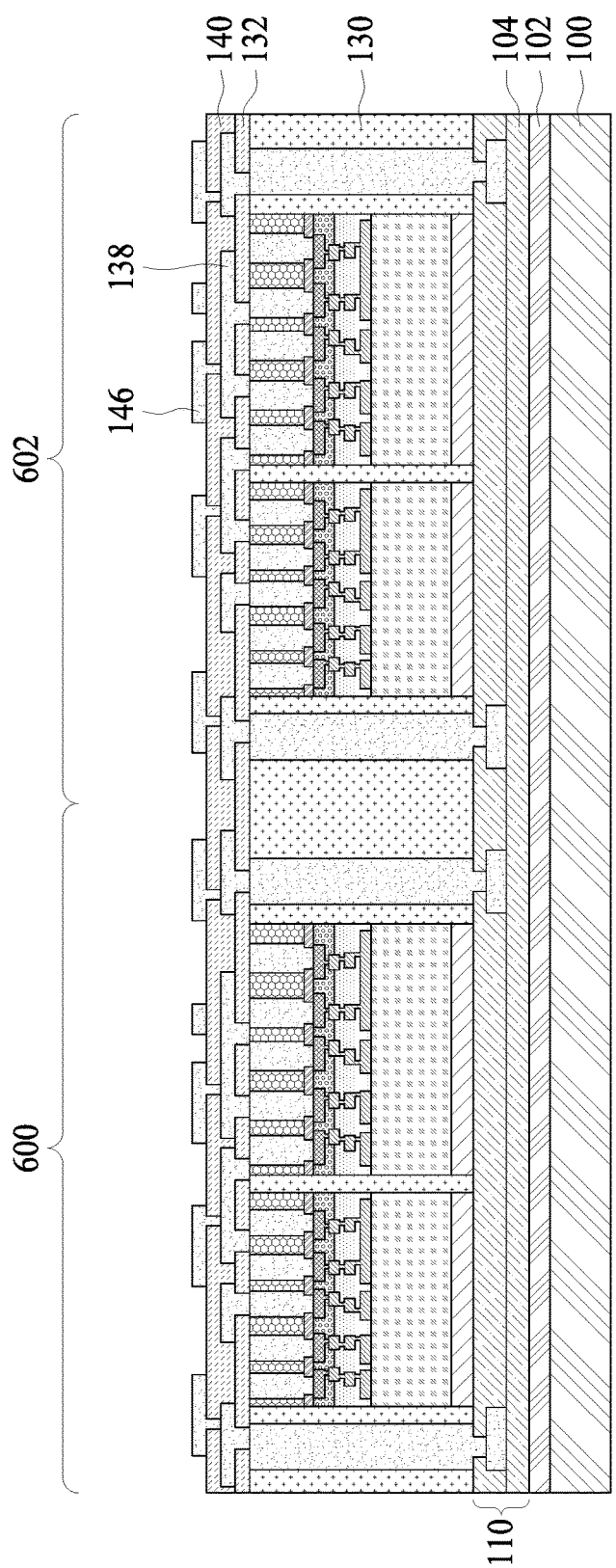

In FIG. 11, metallization pattern 146 with vias is formed on the dielectric layer 140. As an example to form metallization pattern 146, a seed layer (not shown) is formed over the dielectric layer 140 and in openings through the dielectric layer 140. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 146. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 146 and vias. The vias are formed in openings through the dielectric layer 140 to, e.g., portions of the metallization pattern 138.

Figure 12:
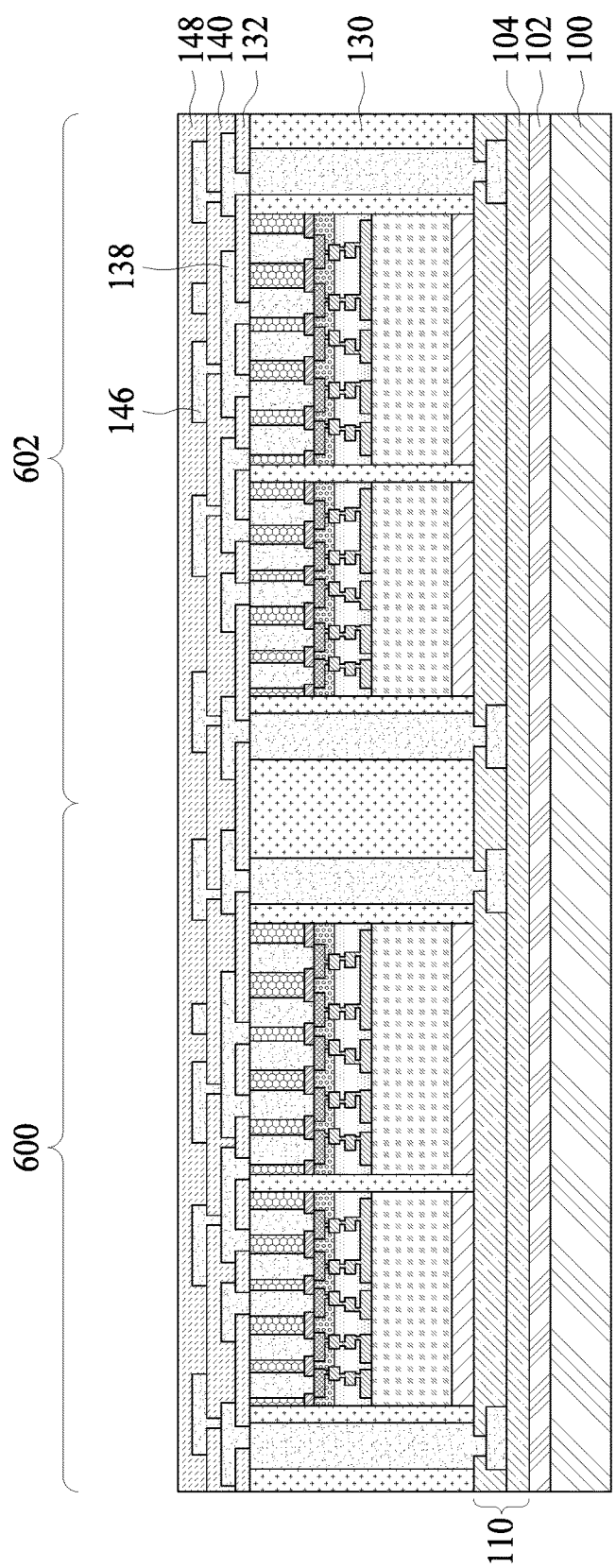

In FIG. 12, the dielectric layer 148 is deposited on the metallization pattern 146 and the dielectric layer 140. In some embodiments, the dielectric layer 148 is formed of a polymer, which may be a photo-sensitive material such as PBO, polyimide, BCB, or the like, that may be patterned using a lithography mask. In other embodiments, the dielectric layer 148 is formed of a nitride such as silicon nitride; an oxide such as silicon oxide, PSG, BSG, BPSG; or the like. The dielectric layer 148 may be formed by spin coating, lamination, CVD, the like, or a combination thereof.

Figure 13:
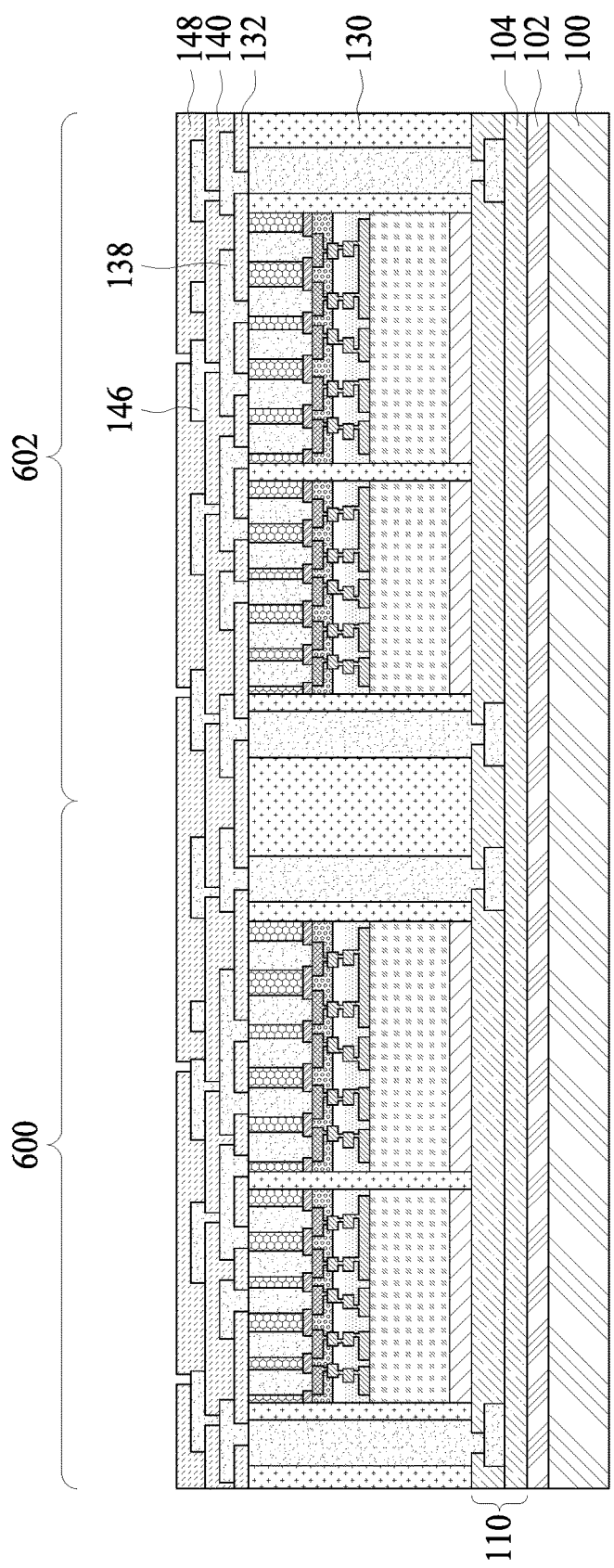

In FIG. 13, the dielectric layer 148 is then patterned. The patterning forms openings to expose portions of the metallization pattern 146. The patterning may be by an acceptable process, such as by exposing the dielectric layer 148 to light when the dielectric layer is a photo-sensitive material or by etching using, for example, an anisotropic etch. If the dielectric layer 148 is a photo-sensitive material, the dielectric layer 148 can be developed after the exposure.

Figure 14:
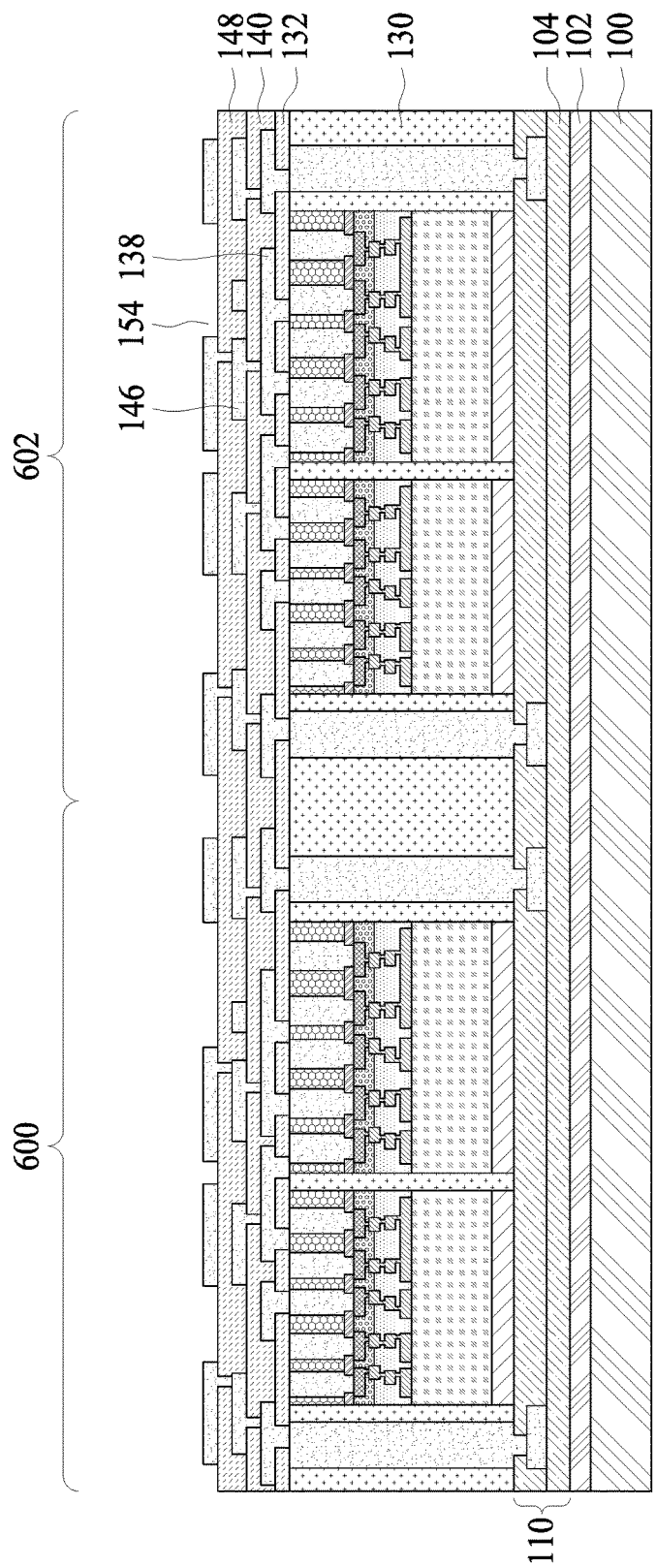

In FIG. 14, metallization pattern 154 with vias is formed on the dielectric layer 148. As an example to form metallization pattern 154, a seed layer (not shown) is formed over the dielectric layer 148 and in openings through the dielectric layer 148. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 154. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 154 and vias. The vias are formed in openings through the dielectric layer 148 to, e.g., portions of the metallization pattern 146.

Figure 15:
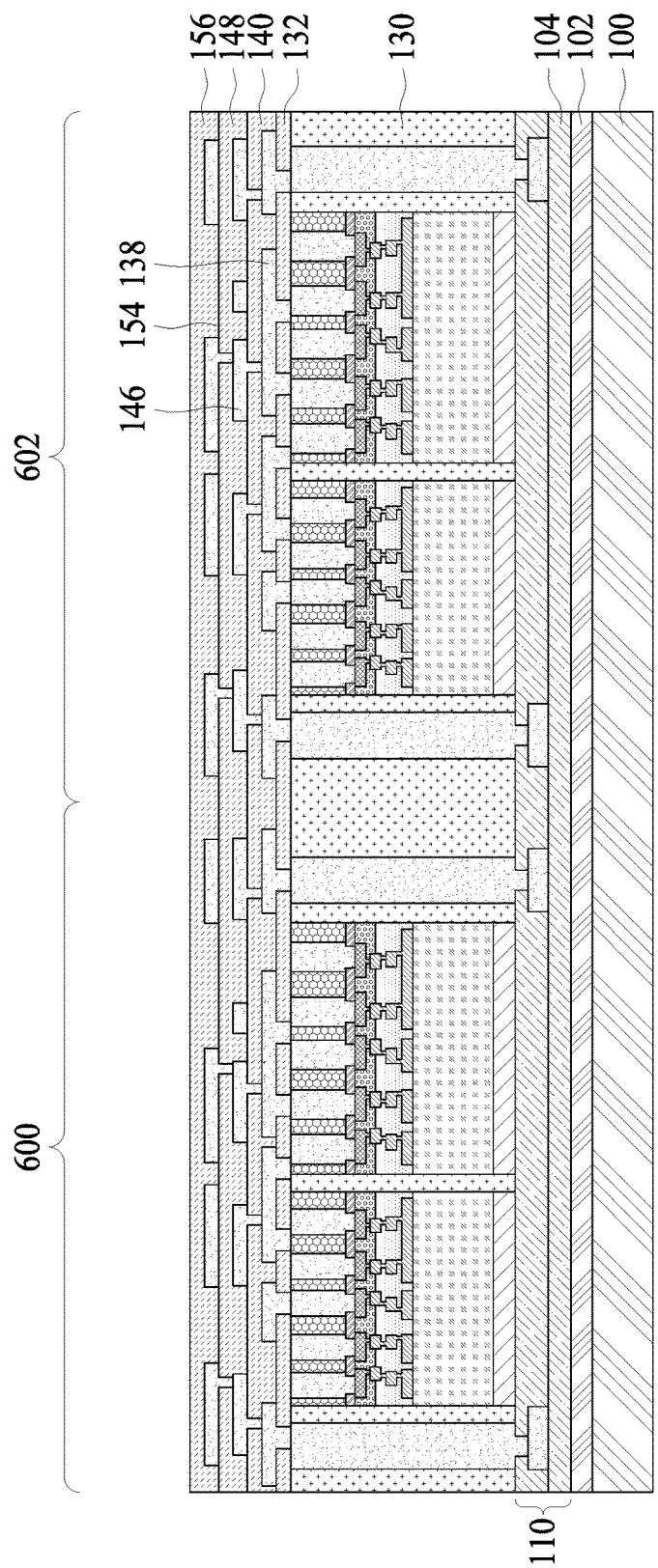

In FIG. 15, the dielectric layer 156 is deposited on the metallization pattern 154 and the dielectric layer 148. In some embodiments, the dielectric layer 156 is formed of a polymer, which may be a photo-sensitive material such as PBO, polyimide, BCB, or the like, that may be patterned using a lithography mask. In other embodiments, the dielectric layer 156 is formed of a nitride such as silicon nitride; an oxide such as silicon oxide, PSG, BSG, BPSG; or the like. The dielectric layer 156 may be formed by spin coating, lamination, CVD, the like, or a combination thereof.

Figure 16:
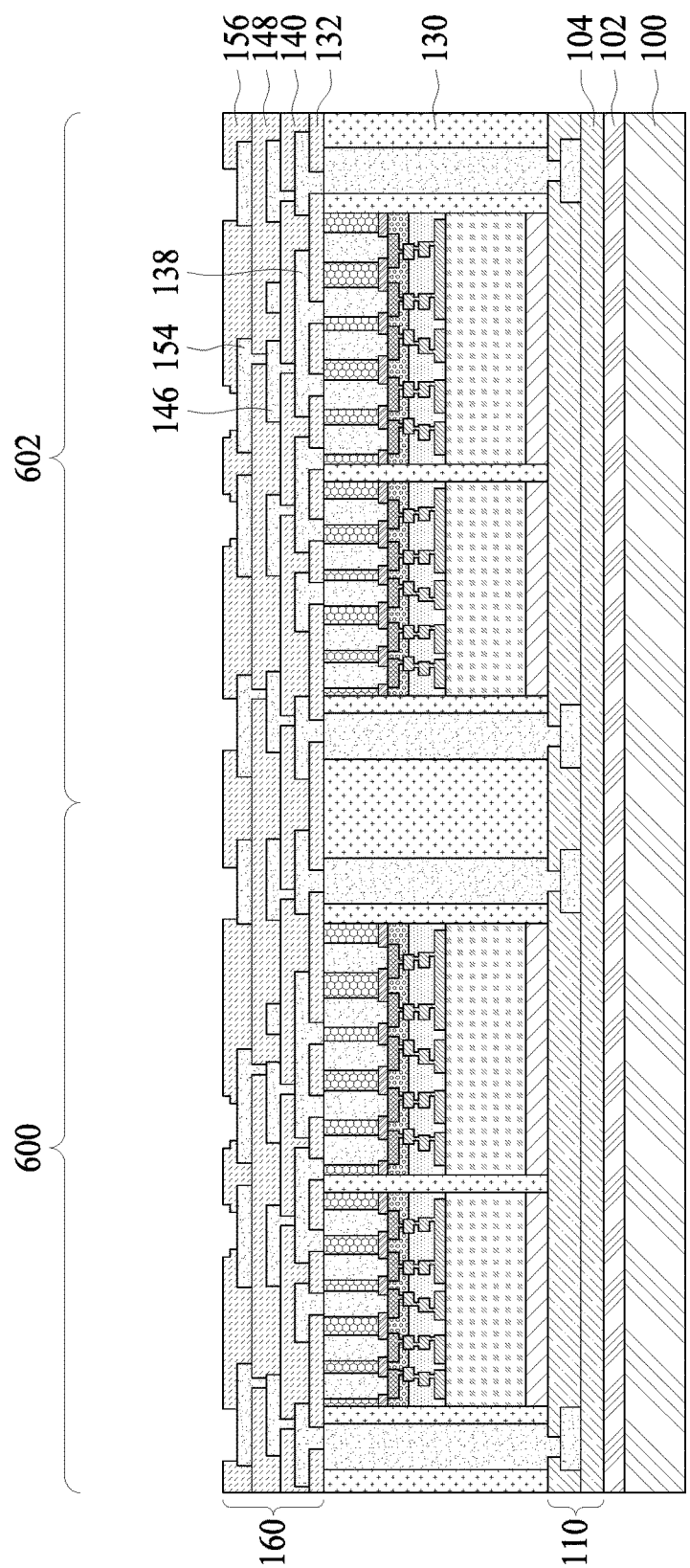

In FIG. 16, the dielectric layer 156 is then patterned. The patterning forms openings to expose portions of the metallization pattern 154. The patterning may be by an acceptable process, such as by exposing the dielectric layer 156 to light when the dielectric layer is a photo-sensitive material or by etching using, for example, an anisotropic etch. If the dielectric layer 156 is a photo-sensitive material, the dielectric layer 156 can be developed after the exposure.

The front-side redistribution structure 160 is shown as an example. More or fewer dielectric layers and metallization patterns may be formed in the front-side redistribution structure 160. If fewer dielectric layers and metallization patterns are to be formed, steps and process discussed above may be omitted. If more dielectric layers and metallization patterns are to be formed, steps and processes discussed above may be repeated. One having ordinary skill in the art will readily understand which steps and processes would be omitted or repeated.

Figure 17:
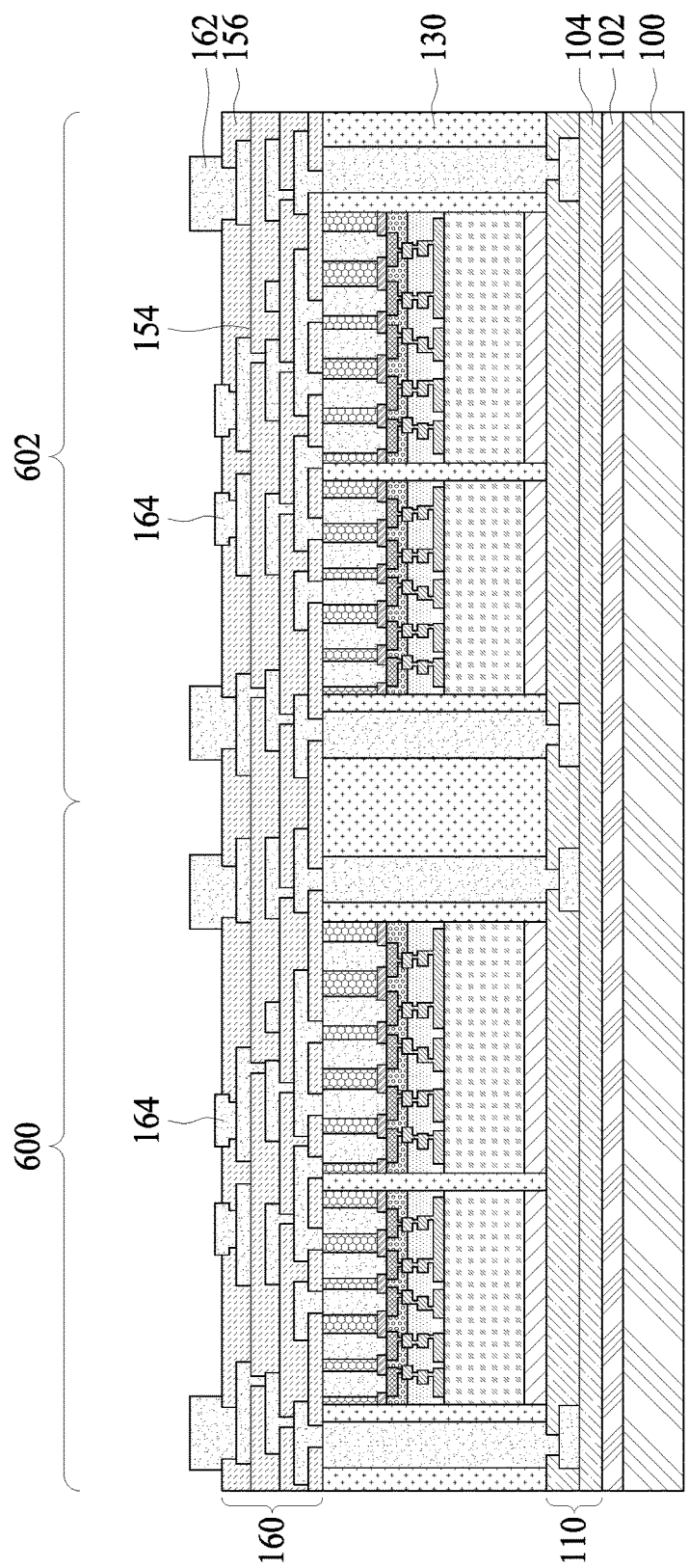

In FIG. 17, pads 162 and 164 are formed on an exterior side of the front-side redistribution structure 160. The pads 162 are used to couple to conductive connectors 166 (see FIG. 18) and may be referred to as under bump metallurgies (UBMs) 162. The pads 164 are used to couple to semiconductor packages 170 (see FIG. 18) having micro bumps as external connectors and may be referred to as micro bump pads 164. In some embodiments, the UBMs 162 are formed at different times and by different processes than the micro bump pads 164. In other embodiments, the UBMs 162 are formed at the same time and by the same processes as the micro bump pads 164.

In the illustrated embodiment, both pads 162 and 164 are formed through openings through the dielectric layer 156 to the metallization pattern 154. As an example to form the pads 162 and 164, a seed layer (not shown) is formed over the dielectric layer 156. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pads 162 and 164. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads 162 and 164. In the embodiment, where the pads 162 and 164 are formed differently, more photo resist and patterning steps may be utilized.

Figure 18:
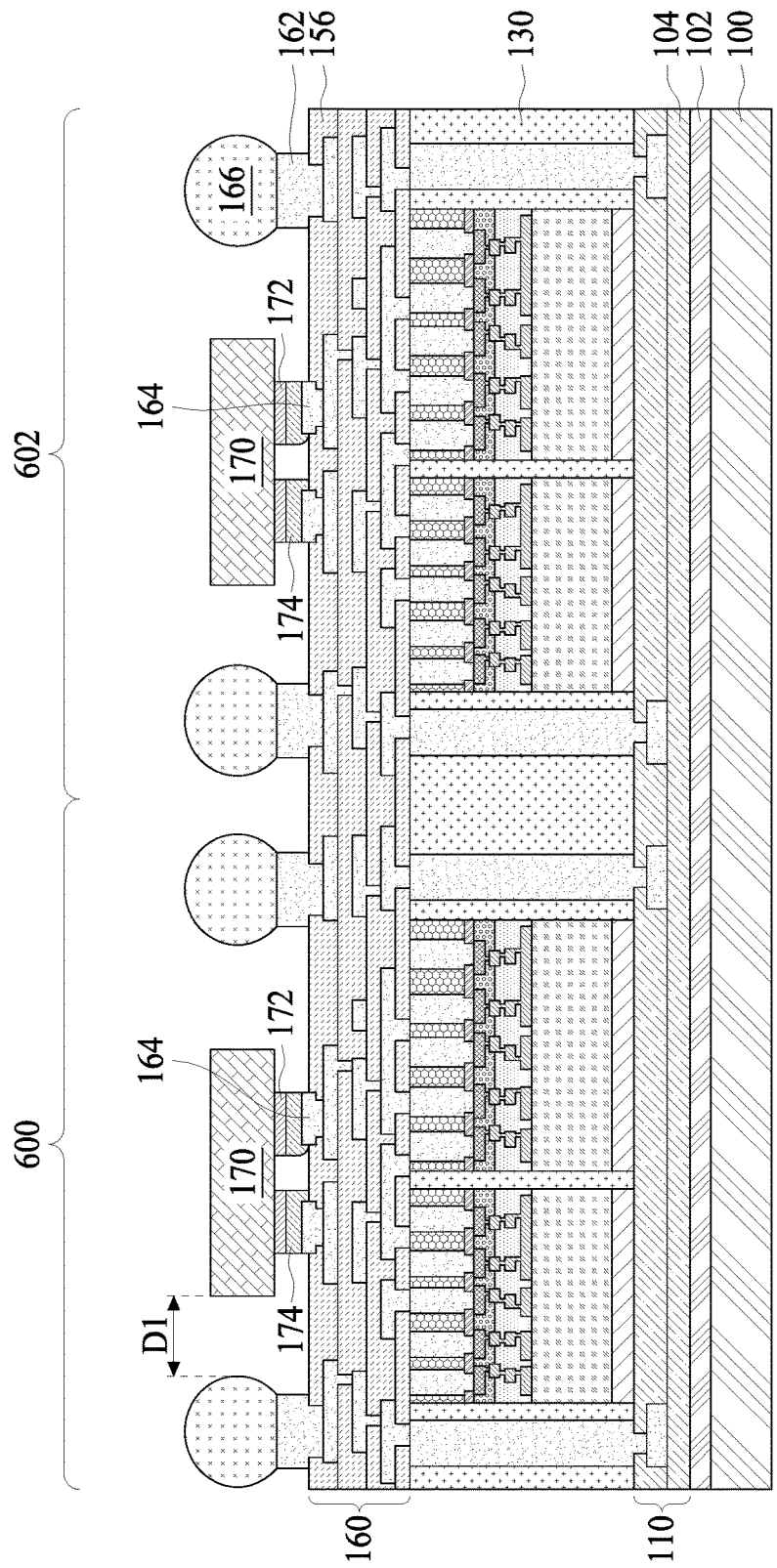

In FIG. 18, conductive connectors 166 are formed on the UBMs 162 and packages 170 are bonded to micro bump pads 164. The packages 170 may be semiconductor devices such as IPD devices, and may be referred to as IPD devices 170. Throughout the description herein, pads 164 may be referred to as micro bump pads 164 and semiconductor package 170 may be referred to as IPD device 170, with the understanding that other types of pads 164 and other types of semiconductor devices or packages 170 are also contemplated within the scope of the present disclosure. The pads 164 are bonded to the contact pads 172 by solder joints 174. In some embodiments, each of the IPD devices 170 has two terminals (e.g. two contact pads 172). In some embodiments, a flux is applied to one or both of the pads 164 and the contact pads 172 before the pads 164 are bonded to the contact pads 172 with the solder joints 174.

The IPD devices 170 may have small size back-side surface areas of, e.g., 2×2 mm or smaller, although other sizes are also possible. In some embodiments, the IPD devices 170 may have a thickness (measured in a direction perpendicular to a major surface of the carrier substrate 100) of about 40 μm or less, while the integrated circuit dies 114 may have thicknesses of in a range from about 300 μm to about 500 μm, such as about 400 μm. In some embodiments, micro bumps (not shown) are formed on contact pads 172 of IPD devices 170. In contrast to conventional solder balls such as those used in a ball grid array (BGA) connector (see conductive connectors 166), which may have a diameter ranging from, e.g., about 150 μm to about 300 μm, micro bumps have much smaller diameters ranging from, e.g., about 10 μm to about 40 μm. The micro bumps may, in some embodiments, have a pitch of about 70 μm or greater. Micro bump pads 164 are appropriately small sized to accommodate the small size of micro bumps.

In some embodiments, the IPD devices 170 cannot be forced onto the micro bump pads 164 during the bonding process. In these embodiments, the bonding of the IPD devices 170 may begin by positioning the IPD device 170 at the level of the conductive connectors 166 with, e.g., a pick-and-place tool. Next, the pick-and-place tool drops the IPD device 170 onto the micro bump pads 164. During a subsequent bonding process, the micro bumps are bonded to micro bump pads 164 by, e.g., a reflow process, and as a result of the bonding process, solder joints are formed which electrically and mechanically connect the contact pads 172 of the IPD device 170 with the micro bump pads 164 of the package. The small size of micro bumps allows fine pitches between micro bump pads 193 and enables high-density connections.

However, the small size of micro bump pads 164 and the fine pitches between micro bump pads 164 also entail certain challenges. For example, during the bonding process, solders joints on adjacent micro bump pads 164 may melt and merge together, forming unintended connections commonly referred to as solder bridges. As another example, if too little solder is used when forming the solder joints between the IPD devices 170 and the micro bump pads 164, unreliable connections commonly referred to as cold joints may occur.

The conductive connectors 166 may be BGA connectors, solder balls, metal pillars, controlled collapse chip connection (C4) bumps, micro bumps, electroless nickel-electroless palladium-immersion gold technique (ENEPIG) formed bumps, or the like. The conductive connectors 166 may include a conductive material such as solder, copper, aluminum, gold, nickel, silver, palladium, tin, the like, or a combination thereof. In some embodiments, the conductive connectors 166 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 166 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 166. The metal cap layer may include nickel, tin, tin-lead, gold, silver, palladium, indium, nickel-palladium-gold, nickel-gold, the like, or a combination thereof and may be formed by a plating process.

FIGS. 19 through 25 illustrate cross-sectional views of a test and rework process in accordance with some embodiments.

Figure 19:
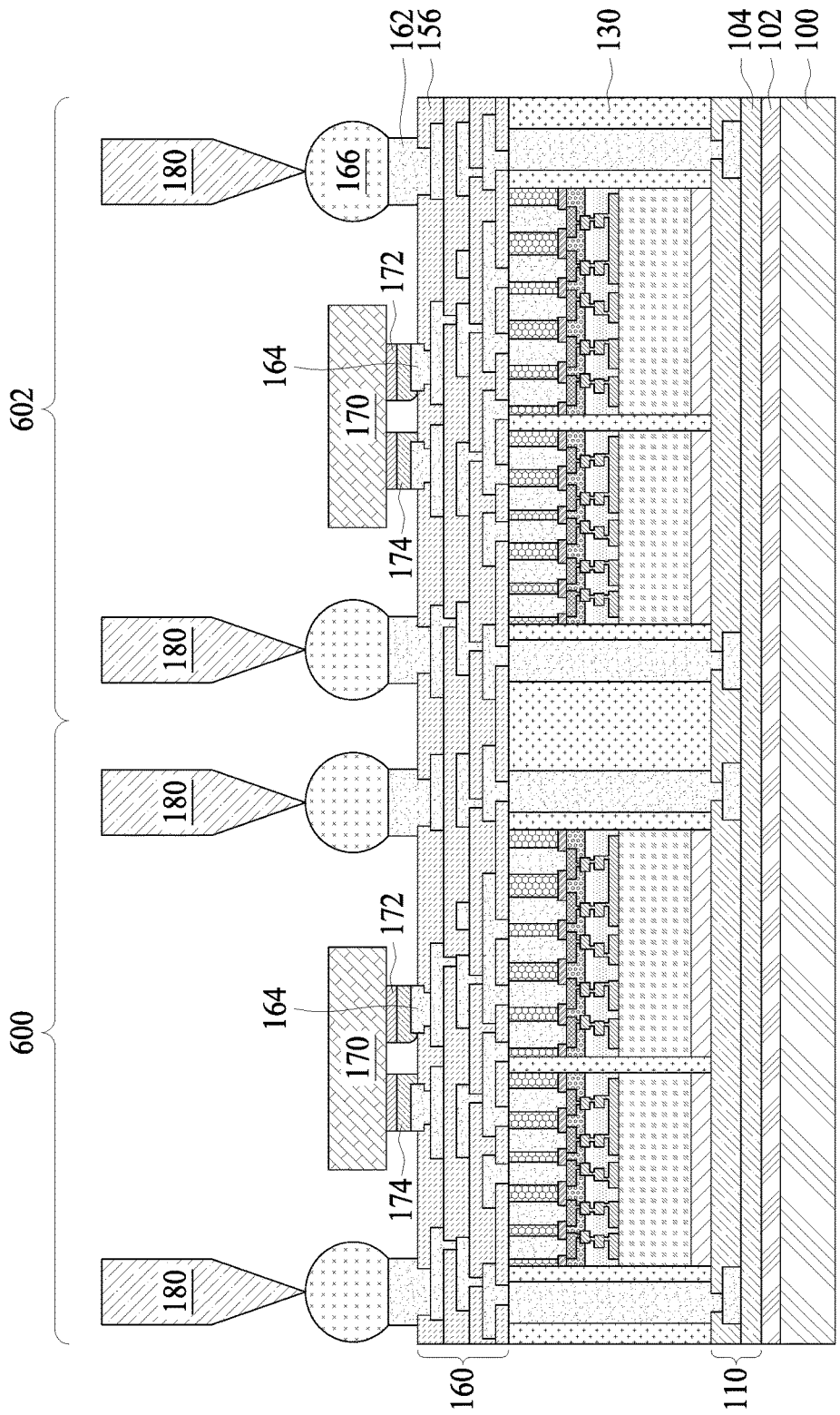
FIGS. 19 through 25 illustrate cross-sectional views of a test and rework process in accordance with some embodiments.

During manufacturing, testing could be performed after the bonding process to identify defective package structures and defective IPD devices 170, as illustrated in FIG. 19. FIG. 19 illustrates test probes 180 being coupled to the conductive connectors 166 to perform testing on the package structure including the IPD devices 170. This testing may be wafer acceptance testing (WAT) and/or circuit performance testing (CP). This testing may detect packages with faulty connections between the IPD device 170 and the package structure (e.g., solder bridges or cold joints), or package structures with damaged IPD devices 170. Instead of discarding the defective package structures, it may be economically beneficial to repair the defective package structures through a rework process by; for example, removing the IPD device 170, removing solder bridges from the micro bump pads 164, and bonding a replacement IPD device 170' to the package structure (see FIGS. 20-23). However, in a package structure having an IPD device 170, the keep out zone of the IPD device 170 (e.g., a distance between a perimeter of the IPD device 170 and a nearby component such as a connector 198, see label D1 in FIG. 18) is typically small, for example, less than about 150 μm. Conventional tools and rework processes are not designed to work with such a small keep out zone, and may damage nearby components if used for repairing the packages with IPD devices 170. Another challenge for repairing defective packages is the lack of effective ways to remove solder left on the micro bump pads 164 after the removal of the IPD device 170. Excessive amount of solder left on the micro bump pads 164 may form solder bridges even before a replacement IDP device 170' is bonded to the package structure. Or, if the excessive amount of solder is not removed, new solder bridges could form during a subsequent bonding processing to bond a replacement IPD device 170' to the package structure.

Figure 20:
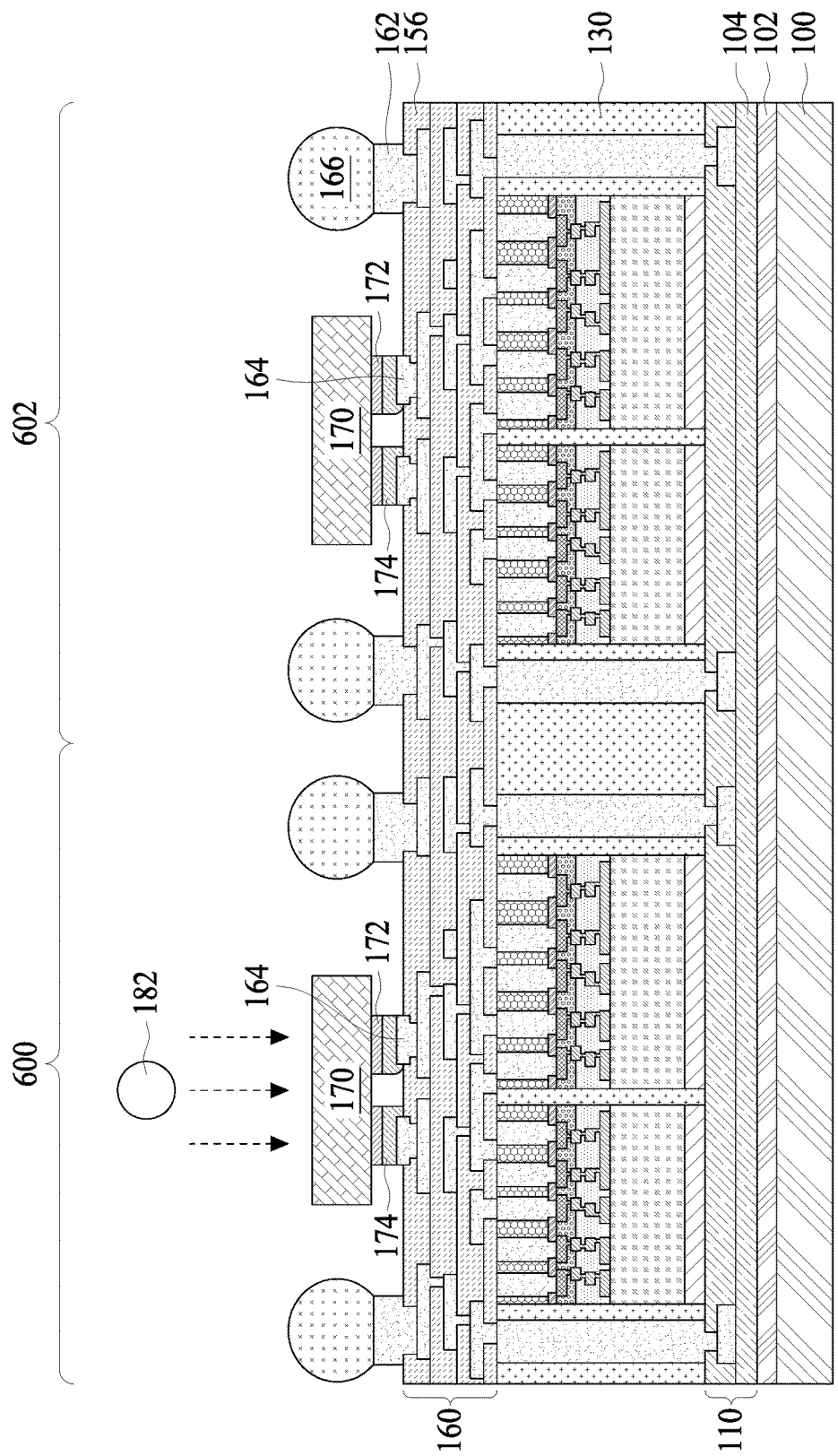

In FIG. 20, a local heating process is performed on the back-side of the IPD device 170 to melt the solder joints 174 formed between the contact pads 172 of the IPD device 170 and the micro bump pads 164. The local heating process utilizes heat source 182 to heat a targeted area of the package instead of the whole package structure. For example, the local heating process heats only an area proximate the micro bump pads 164 of the package structure, where solder joints 174 between the IPD device 170 and the package structure are located, while minimizing or reducing the negative impact of heating on the integrity of other connectors or components of the package structure. In an embodiment, the heating area of the local heating process is in a range from about 100% to about 120% of the size of the IPD device 170 (e.g. back-side surface area of IPD device 170). In some embodiments, the pads 162 and the conductive connectors 166 nearest the defective IPD device 170 are slightly heated by the heating source 182 and these pads 162 and conductive connectors 166 form a thicker intermetallic compound (IMC) layer than the other pads 162 and conductive connectors 166 on the package structure (see FIG. 24 discussed below). In some embodiments, the heat source 182 is a laser, such as a laser with a major wavelength in an infrared wavelength range (e.g. greater than or equal to about 700 nm). In some embodiments, the heat source 182 may comprise multiple laser beams directed at the defective IPD device 170. Some examples of lasers sources with major wavelengths in this range are InGaAs, GaAs, GaAlAs, Ar, and Kr, although other lasers sources may also be used. Other suitable laser that can provide sufficient heating of the solder joints 174 are also contemplated within the scope of the present disclosure.

In some embodiments, the heating source 182 will irreparably damage the IPD device 170 during the heating of the solder joints 174. However, the IPD device 170 was already found to be defective, and thus, was being removed and discarded so the damage is inconsequential in these embodiments.

After the heating source 182 heats the IPD device 170 sufficiently to melt the solder joints 174, a pick-and-place tool 184 (sometimes referred to as a bond head 184) is attached to the IPD device 170 that is to be removed by, e.g., a vacuum.

Figure 21:
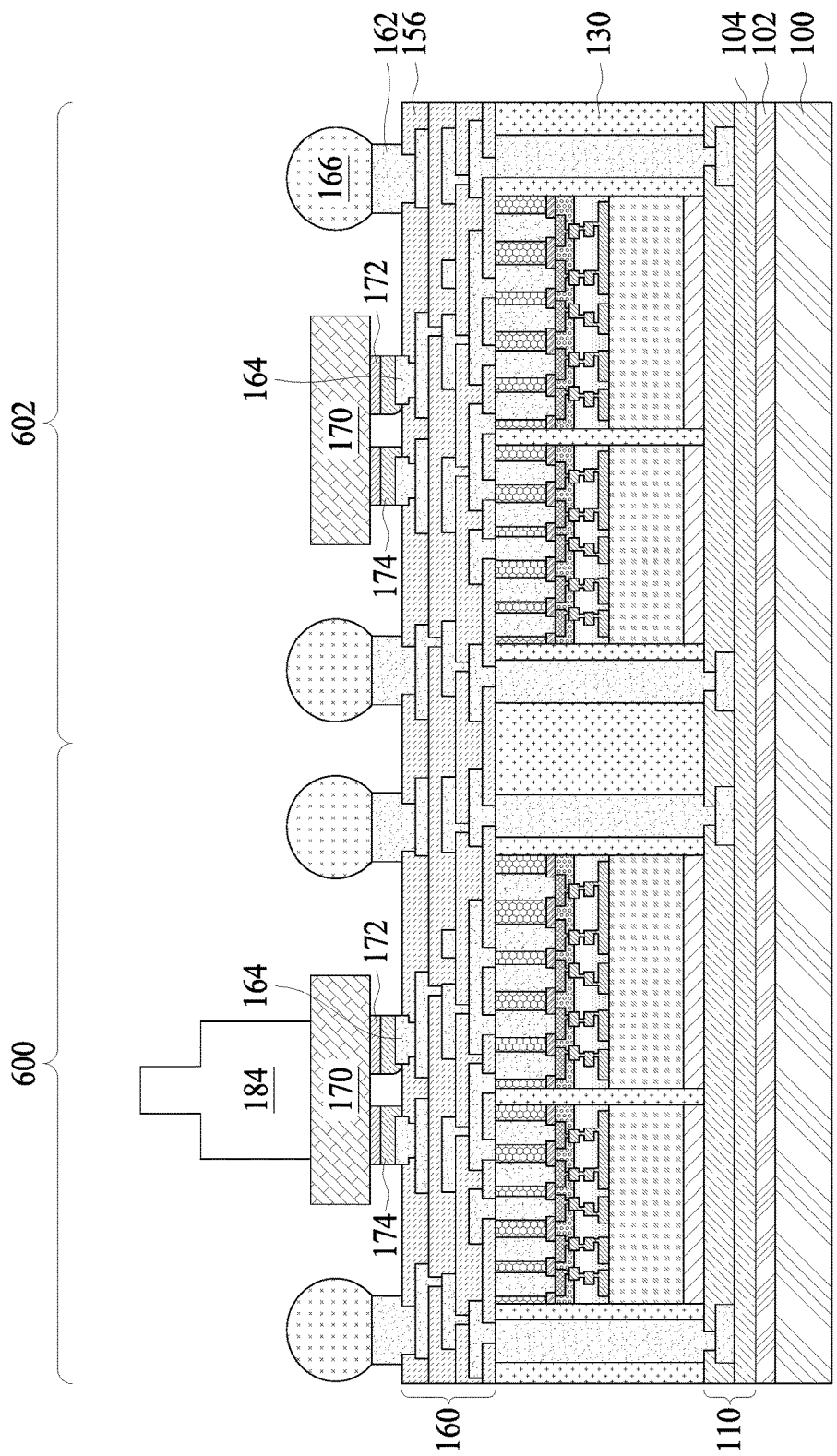
Figure 22:
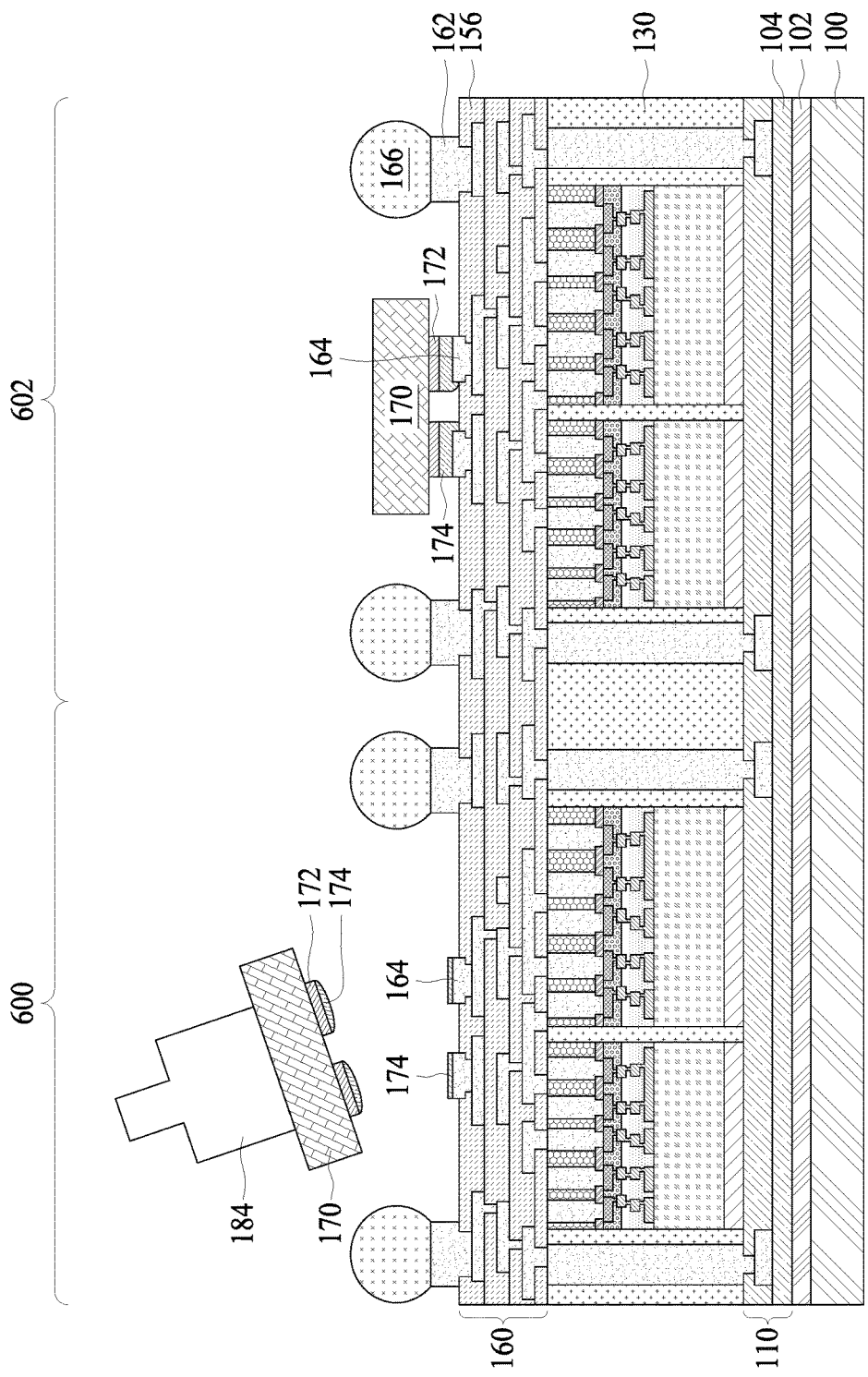

Next, as illustrated in FIG. 21, the IPD device 170 is removed from the micro bump pads 164 by the pick-and-place tool 184. In some embodiments, portions of melted solder 174 adhere to the contact pads 172 of the IPD device 170 and are removed from the micro bump pads 164 with the removal of IPD device 170, while other portions of the melted solder 174 remain on the micro bump pads 164.

Although not shown, in some embodiments, the remaining solder material 174 on the micro bump pads 164 is removed by using for example, e.g., a solder-wettable piece or a nozzle supplied with a vacuum.

Figure 23:
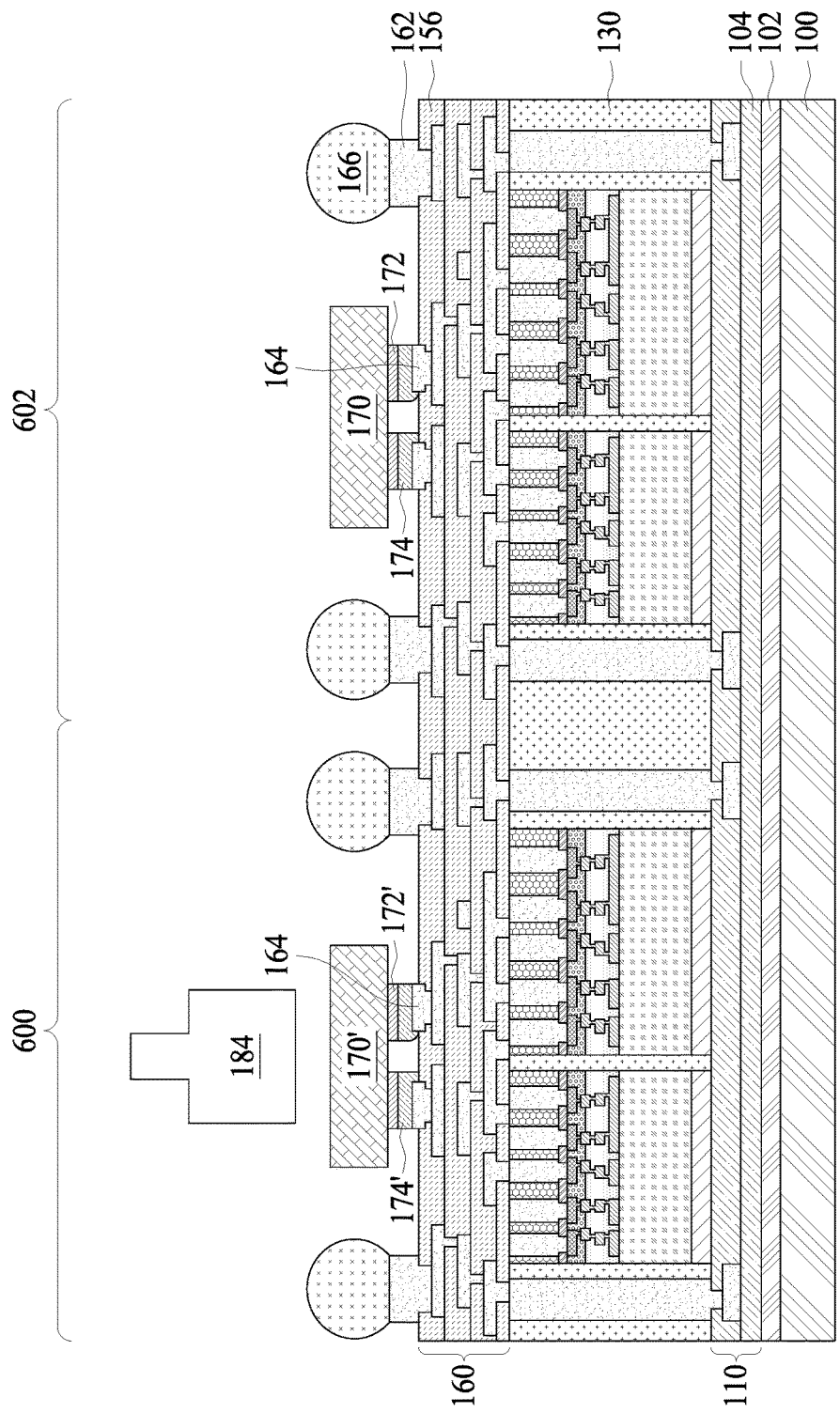

Next, as illustrated in FIG. 23, the pick-and-place tool 184 picks up a replacement IPD device 170' and attaches the IPD device 170' to the micro bump pads 164. The IPD device 170' may be another IPD device of the same type as the IPD device 170 to replace a defective IPD device 170. The IPD device 170' may be the same IPD device 170 that was removed earlier if the IPD device 170 is determined to be functional and could be re-used. Once the IPD device 170' is attached to the micro bump pads 164, appropriate bonding methods, such as reflow, may be used to bond the IPD device 170' to the package structure with a bonding joint 174'. In some embodiments, the bonding process of the replacement IPD device 170' does not include flux. Although not shown in FIG. 23, an underfill material may be formed in the gap between the IPD devices 170 and 170' and the package structure.

Figure 24:
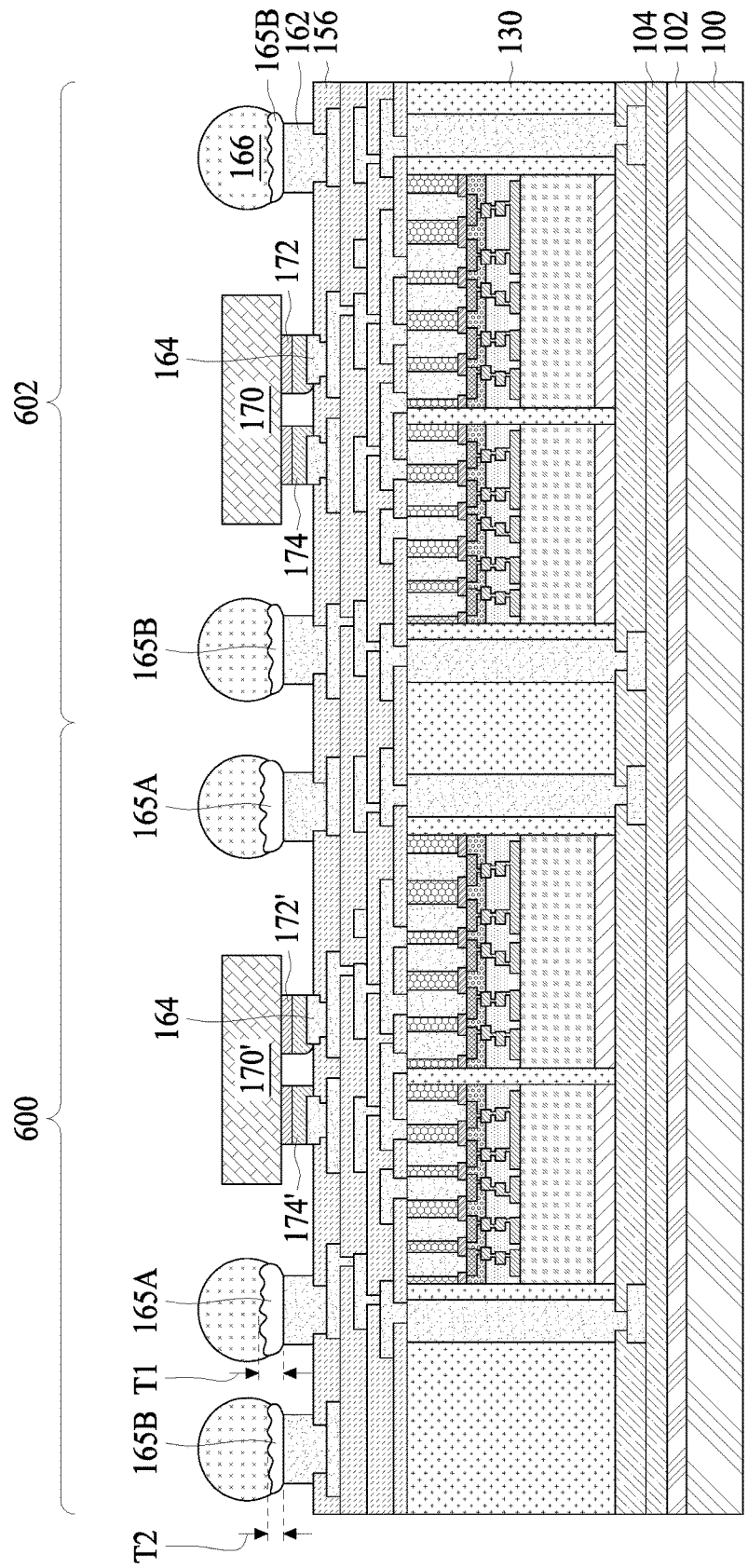

After the replacement of one or more of the IPD devices 170, the pads 162 and conductive connectors 166 nearest the replacement IPD device 170' may have a thicker IMC layer 165A than the IMC layers 165B of the other pads 162 and conductive connectors 166 on the package structure as illustrated in FIG. 24. Please note that FIG. 24 illustrates an additional pad 162 and conductive connector 166 adjacent the replacement IPD device 170' for illustrative purposes and this additional and connector is not shown in other Figures. The IMC layers 165 are formed of a combination of the materials in the pads 162 and the conductive connectors 166. In some embodiments, the IMC layers 165A of the conductive connectors 166 nearest the replacement IPD device 170' have a thickness T1 which is larger than a thickness T2 of the IMC layers 165B of the other conductive connectors 166. In some embodiments, the thickness T1 may be at least two times larger than the thickness T2. The thickness of the IMC layers 165A are thicker than the IMC layers 165B because the conductive connectors 166 and pads 162 nearest the defective IPD device 170 are slightly heated by the heating source 182 (see FIG. 20) and this additional heating of the pads 162 and conductive connectors 166 causes additional formation of the IMC layer 165A.

Figure 25:
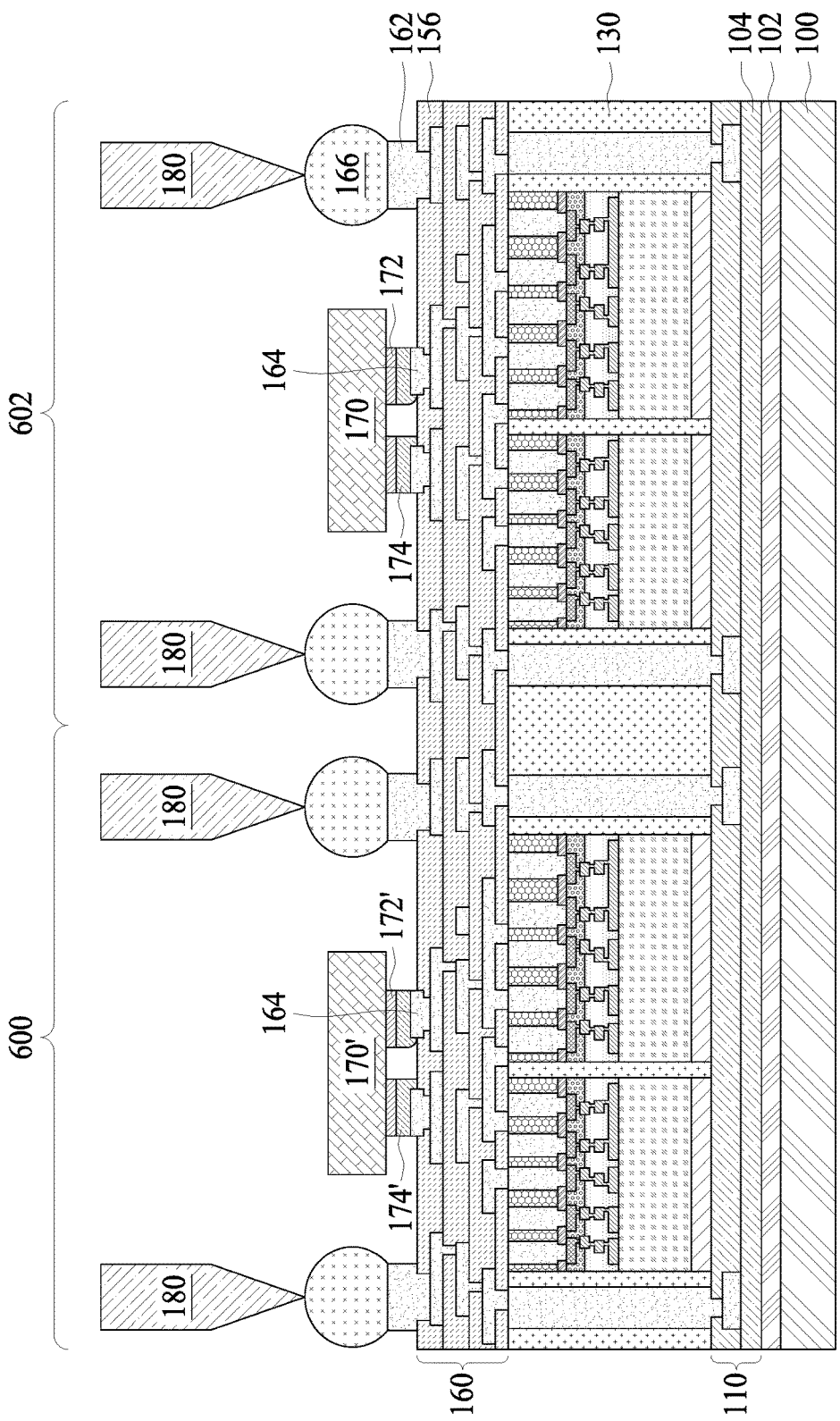

After the replacement of one or more of the IPD devices 170, testing is again performed to identify defective package structures and defective IPD devices 170, as illustrated in FIG. 25. FIG. 25 illustrates test probes 180 being coupled to the conductive connectors 166 to perform testing on the package structure including the IPD devices 170.

Although the above description illustrates one defective IPD device 170 in the first package region 600, there could be more or less defective IPD devices 170 in that same region and/or other regions.

Figure 26:
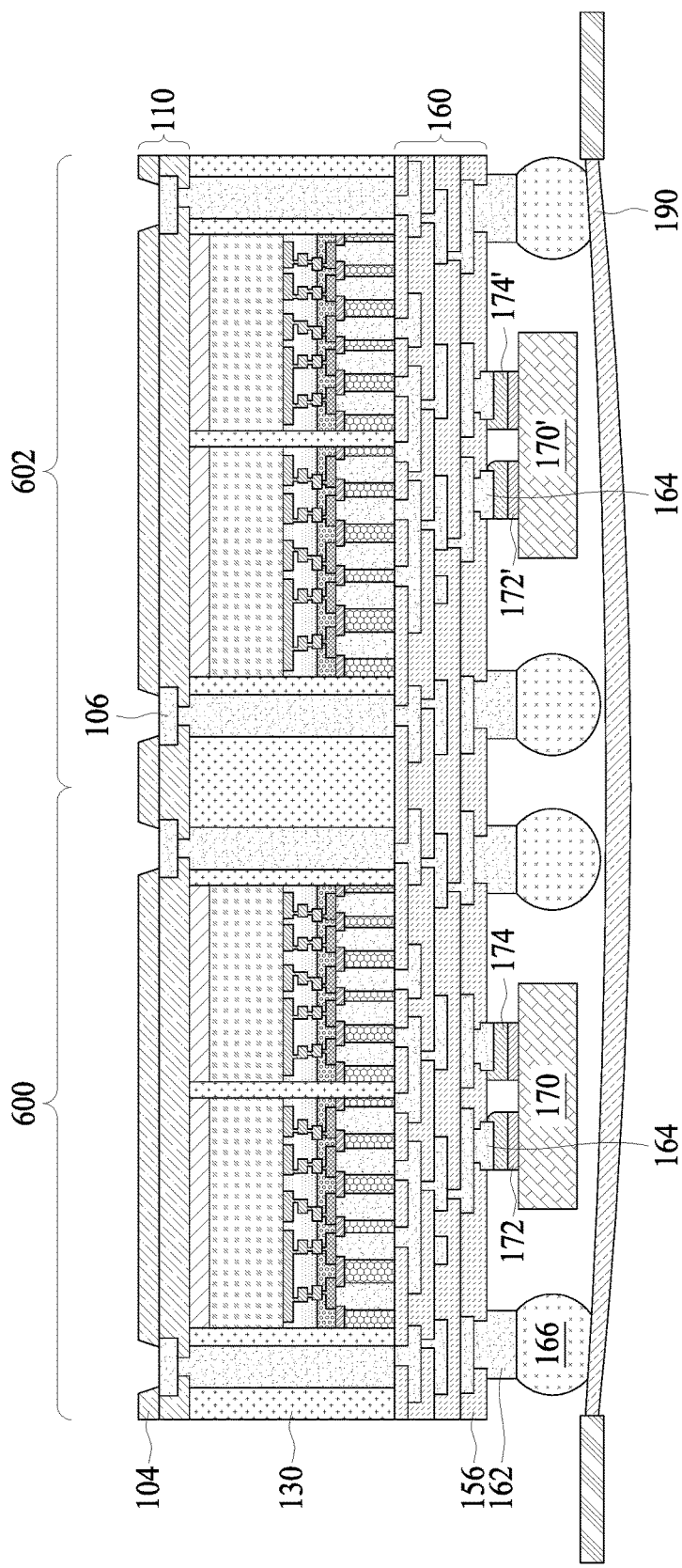
FIGS. 26 through 28 illustrate cross-sectional views of intermediate steps during a process for further forming a first package and for attaching other package structures to the first package in accordance with some embodiments.
Figure 27:
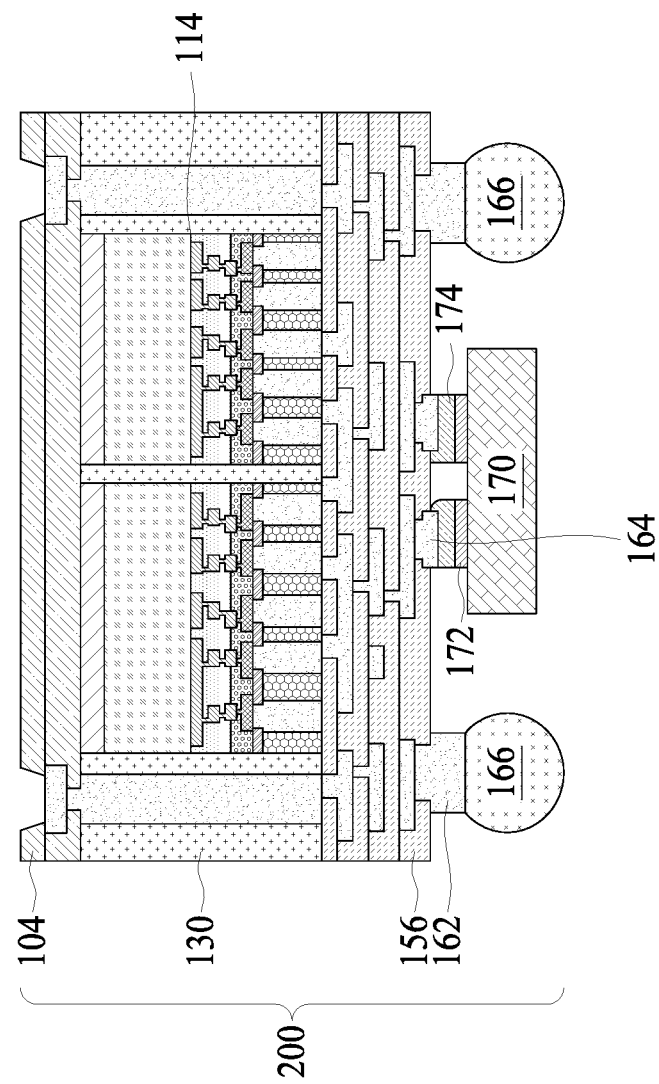
Figure 28:
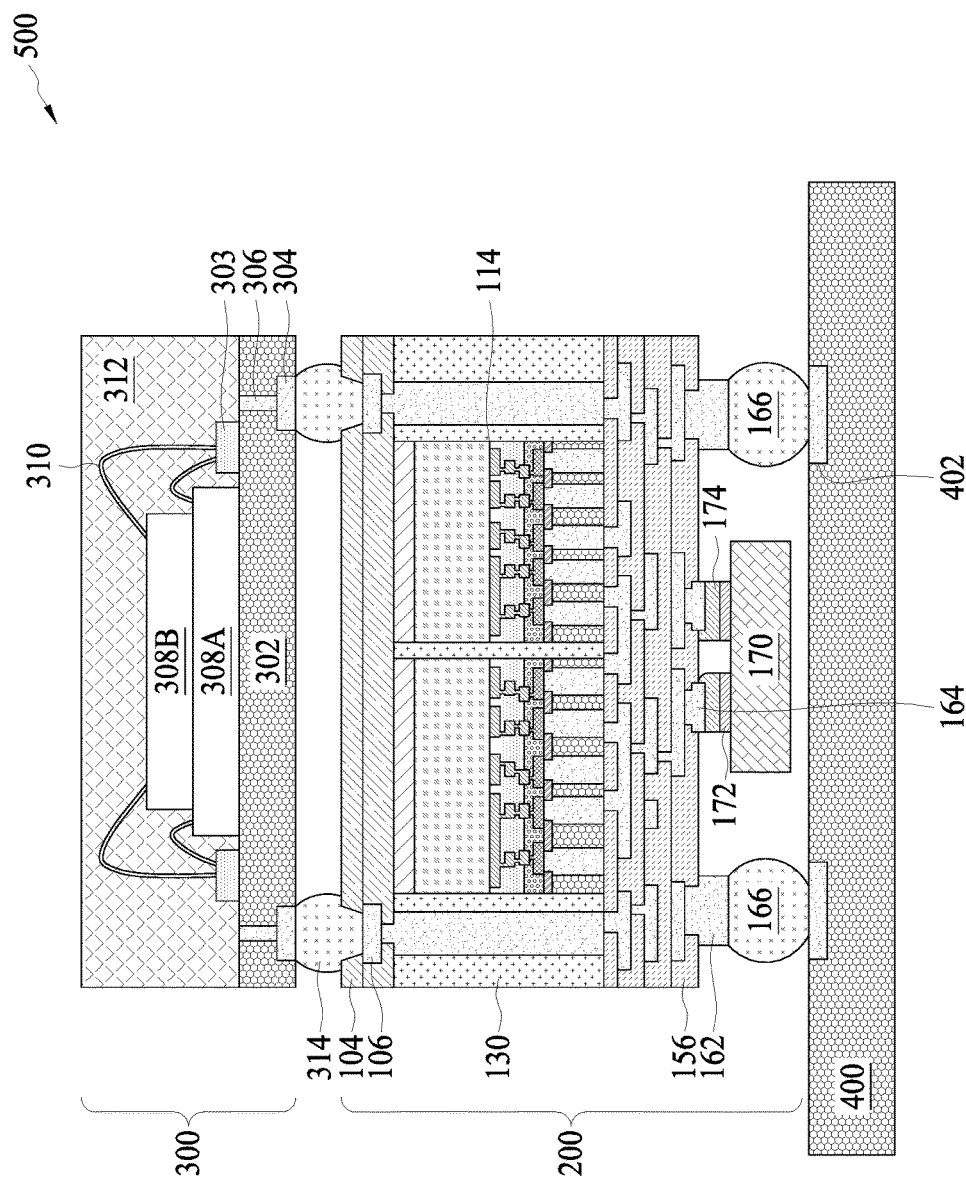

FIGS. 26 through 28 illustrate cross-sectional views of intermediate steps during a process for further forming a first package and for attaching other package structures to the first package in accordance with some embodiments.

In FIG. 26, a carrier substrate de-bonding is performed to detach (de-bond) the carrier substrate 100 from the backside redistribution structure, e.g., dielectric layer 104. In accordance with some embodiments, the de-bonding includes projecting a light such as a laser light or an UV light on the release layer 102 so that the release layer 102 decomposes under the heat of the light and the carrier substrate 100 can be removed. The structure is then flipped over and placed on a tape 190.

As further illustrated in FIG. 26, openings are formed through the dielectric layer 104 to expose portions of the metallization pattern 106. The openings may be formed, for example, using laser drilling, etching, or the like.

FIG. 27 illustrates a resulting, singulated package 200 after a singulation process is performed by sawing along scribe line regions e.g., between adjacent regions 600 and 602. The sawing singulates the first package region 600 from the second package region 602. The singulation results in package 200, which may be from one of the first package region 600 or the second package region 602, being singulated. The package 200 may also be referred to as an integrated fan-out (InFO) package 200.

FIG. 28 illustrates a package structure 500 including the package 200 (may be referred to as a first package 200), a second package 300, and a substrate 400. The second package 300 includes a substrate 302 and one or more stacked dies 308 (308A and 308B) coupled to the substrate 302. The substrate 302 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 302 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 302 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 302.

The substrate 302 may include active and passive devices (not shown in FIG. 28). As one of ordinary skill in the art will recognize, a wide variety of devices such as transistors, capacitors, resistors, combinations of these, and the like may be used to generate the structural and functional requirements of the design for the semiconductor package 300. The devices may be formed using any suitable methods.

The substrate 302 may also include metallization layers (not shown) and through vias 306. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 302 is substantially free of active and passive devices.

The substrate 302 may have bond pads 303 on a first side the substrate 202 to couple to the stacked dies 308, and bond pads 304 on a second side of the substrate 302, the second side being opposite the first side of the substrate 302, to couple to the conductive connectors 314. In some embodiments, the bond pads 303 and 304 are formed by forming recesses (not shown) into dielectric layers (not shown) on the first and second sides of the substrate 302. The recesses may be formed to allow the bond pads 303 and 304 to be embedded into the dielectric layers. In other embodiments, the recesses are omitted as the bond pads 303 and 304 may be formed on the dielectric layer. In some embodiments, the bond pads 303 and 304 include a thin seed layer (not shown) made of copper, titanium, nickel, gold, palladium, the like, or a combination thereof. The conductive material of the bond pads 303 and 304 may be deposited over the thin seed layer. The conductive material may be formed by an electrochemical plating process, an electroless plating process, CVD, ALD, PVD, the like, or a combination thereof. In an embodiment, the conductive material of the bond pads 303 and 304 is copper, tungsten, aluminum, silver, gold, the like, or a combination thereof.

In an embodiment, the bond pads 303 and 304 are UBMs that include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 303 and 304. Any suitable materials or layers of material that may be used for the UBMs 303 and 304 are fully intended to be included within the scope of the current application. In some embodiments, the through vias 306 extend through the substrate 302 and couple at least one bond pad 303 to at least one bond pad 304.

In the illustrated embodiment, the stacked dies 308 are coupled to the substrate 302 by wire bonds 310, although other connections may be used, such as conductive bumps. In an embodiment, the stacked dies 308 are stacked memory dies. For example, the stacked memory dies 308 may include low-power (LP) double data rate (DDR) memory modules, such as LPDDR1, LPDDR2, LPDDR3, or the like memory modules.

In some embodiments, the stacked dies 308 and the wire bonds 310 may be encapsulated by a molding material 312. The molding material 312 may be molded on the stacked dies 308 and the wire bonds 310, for example, using compression molding. In some embodiments, the molding material 312 is a molding compound, a polymer, an epoxy, silicon oxide filler material, the like, or a combination thereof. A curing step may be performed to cure the molding material 312, wherein the curing may be a thermal curing, a UV curing, the like, or a combination thereof.

In some embodiments, the stacked dies 308 and the wire bonds 310 are buried in the molding material 312, and after the curing of the molding material 312, a planarization step, such as a grinding, is performed to remove excess portions of the molding material 312 and provide a substantially planar surface for the second packages 300.

After the second packages 300 are formed, the packages 300 are bonded to the first packages 200 by way of conductive connectors 314, the bond pads 304, and the metallization pattern 106. In some embodiments, the stacked memory dies 308 may be coupled to the integrated circuit dies 114 through the wire bonds 310, the bond pads 303 and 304, through vias 306, the conductive connectors 314, and the through vias 112.

The conductive connectors 314 may be similar to the conductive connectors 166 described above and the description is not repeated herein, although the conductive connectors 314 and 166 need not be the same. In some embodiments, before bonding the conductive connectors 314, the conductive connectors 314 are coated with a flux (not shown), such as a no-clean flux. The conductive connectors 314 may be dipped in the flux or the flux may be jetted onto the conductive connectors 314. In another embodiment, the flux may be applied to the surfaces of the metallization patterns 106.

In some embodiments, the conductive connectors 314 may have an epoxy flux (not shown) formed thereon before they are reflowed with at least some of the epoxy portion of the epoxy flux remaining after the second package 300 is attached to the first package 200. This remaining epoxy portion may act as an underfill to reduce stress and protect the joints resulting from the reflowing the conductive connectors 314. In some embodiments, an underfill (not shown) may be formed between the second package 300 and the first package 200 and surrounding the conductive connectors 314. The underfill may be formed by a capillary flow process after the second package 300 is attached or may be formed by a suitable deposition method before the second package 300 is attached.

The bonding between the second package 300 and the first package 200 may be a solder bonding or a direct metal-to-metal (such as a copper-to-copper or tin-to-tin) bonding. In an embodiment, the second package 300 is bonded to the first package 200 by a reflow process. During this reflow process, the conductive connectors 314 are in contact with the bond pads 304 and the metallization patterns 106 to physically and electrically couple the second package 300 to the first package 200. After the bonding process, an IMC (not shown) may form at the interface of the metallization patterns 106 and the conductive connectors 314 and also at the interface between the conductive connectors 314 and the bond pads 304 (not shown).

The semiconductor package 500 includes the packages 200 and 300 being mounted to a substrate 400. The substrate 400 may be referred to a package substrate 400. The semiconductor package 300 is mounted to the package substrate 400 using the conductive connectors 166.

The package substrate 400 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 400 may be a SOI substrate. Generally, an SOI substrate includes a layer of a semiconductor material such as epitaxial silicon, germanium, silicon germanium, SOI, SGOI, or combinations thereof. The package substrate 400 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 400.

The package substrate 400 may include active and passive devices (not shown in FIG. 28). As one of ordinary skill in the art will recognize, a wide variety of devices such as transistors, capacitors, resistors, combinations of these, and the like may be used to generate the structural and functional requirements of the design for the semiconductor package 500. The devices may be formed using any suitable methods.

The package substrate 400 may also include metallization layers and vias (not shown) and bond pads 402 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 400 is substantially free of active and passive devices.

In some embodiments, the conductive connectors 166 can be reflowed to attach the package 200 to the bond pads 402. The conductive connectors 166 electrically and/or physically couple the substrate 400, including metallization layers in the substrate 400, to the first package 200.

The conductive connectors 166 may have an epoxy flux (not shown) formed thereon before they are reflowed with at least some of the epoxy portion of the epoxy flux remaining after the package 200 is attached to the substrate 400. This remaining epoxy portion may act as an underfill to reduce stress and protect the joints resulting from the reflowing the conductive connectors 166. In some embodiments, an underfill (not shown) may be formed between the first package 200 and the substrate 400 and surrounding the conductive connectors 166. The underfill may be formed by a capillary flow process after the package 200 is attached or may be formed by a suitable deposition method before the package 200 is attached.

Embodiments of the device and methods in the current disclosure have many advantages. For example, the rework processes can be used to repair semiconductor packages with connection problems (e.g., solder bridge or cold joint) or damaged device (e.g., damaged IPD device 170), thus allowing re-use of good parts (e.g., properly functioning packages 200 or IPD device 170). This might be economically beneficial, especially considering the high cost of some System-On-Chip (SoC) dies used in PoP packages. Although the rework processes and tools are disclosed with reference to a PoP package having a small IPD device attached to a package, the rework processes and tools can be applied to many different semiconductor packages and applications. The rework processes can be easily applied to wafer level or unit level repair. In addition, the rework processes and tools can be incorporated into an automated tool chain, thus enabling automated rework processes.

An embodiment is a method including bonding a first package to a first set of conductive pads of a second package with a first set of solder joints, testing the first package for defects, heating the first set of solder joints by directing a laser beam at a surface of the first package based on testing the first package for defects, after the first set of solder joints are heated, removing the first package, and bonding a third package to the first set of conductive pads of the second package.

Another embodiment is a method including directing a laser beam at a first semiconductor package to melt solder joints, the solder joints bonding first contact pads of the first semiconductor package to second contact pads of a second semiconductor package, removing the first semiconductor package using a first bond head, and bonding a replacement semiconductor package to the second contact pads.

A further embodiment is a package structure including a first package. The first package includes a first die over a dielectric layer, an electrical connector adjacent the first die and extending from a first side of the first die to a second side of the first die, the second side being opposite the first side, a molding compound at least laterally encapsulating the first die and the electrical connector, an interconnect structure over the first side of the first die and the molding compound, an integrated passive device over and electrically coupled to the interconnect structure with a first set of solder joints, and a first set of conductive connectors over and electrically coupled to the interconnect structure, the first set of conductive connectors comprising a first conductive connector and a second conductive connector, the first conductive connector being nearer to the integrated passive device than the second conductive connector, the first conductive connector having a thicker intermetallic compound layer than the second conductive connector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
 forming a second package, wherein forming the second package comprises:
  forming a back-side redistribution structure;
  forming first electrical connectors over the back-side redistribution structure, wherein forming the first electrical connectors comprises forming a seed layer over the back-side redistribution structure and plating a conductive material over the seed layer;
  attaching a first die to the back-side redistribution structure using an adhesive;
  forming an encapsulant surrounding the first die and the first electrical connectors;
  planarizing the first die, the first electrical connectors, and the encapsulant such that the first electrical connectors have a first height measured between a bottommost surface of the first electrical connectors and a topmost surface of the first electrical connectors, the encapsulant has a second height measured between a bottommost surface of the encapsulant and a topmost surface of the encapsulant, the first die has a third height measured between a bottommost surface of the first die and a topmost surface of the first die, the first height being greater than the second height, the second height being greater than the third height, wherein the topmost surface of the first die is level with the topmost surface of the encapsulant and the topmost surface of the first electrical connectors; and
  forming a front-side redistribution structure over the first die, the first electrical connectors, and the encapsulant, the front-side redistribution structure comprising a first set of conductive pads and a second conductive pad adjacent the first set of conductive pads, the second conductive pad having a height greater than heights of the conductive pads of the first set of conductive pads;
 forming a metal pillar on the second conductive pad, the metal pillar having vertical sidewalls, the metal pillar comprising a material different from a material of the second conductive pad;
 forming a metal cap layer over the metal pillar, the metal cap layer comprising a material different from the material of the metal pillar and the material of the second conductive pad;
 bonding a front-side surface of a first package to the first set of conductive pads of the second package with a first set of solder joints, the first package having a height less than a height of the metal pillar;
 testing the first package for defects;
 heating the first set of solder joints by directing a laser beam at a back-side surface of the first package, the back-side surface of the first package being opposite the front-side surface of the first package, wherein heating the first package is based on testing the first package for defects;
 when the first set of solder joints are heated, removing the first package;
 after removing the first package, re-testing the first package to determine whether the first package is functional;
 when the first package is removed, bonding a third package to the first set of conductive pads of the second package; and
 after testing the first package for defects, sawing the second package to singulate the second package from a fourth package.

2. The method of claim 1, wherein heating the first set of solder joints by directing a laser beam at a surface of the first package based on testing the first package for defects further comprises:
 when the testing the first package for defects results in the first package not having defects, not heating the first set of solder joints; and
 when the testing the first package for defects results in the first package having defects, heating the first set of solder joints by directing a laser beam at the surface of the first package.

3. The method of claim 1, wherein the first package is an integrated passive device package.

4. The method of claim 1 further comprising:
 forming a first set of solder balls on the front-side redistribution structure, the first package being bonded to the front-side redistribution structure, wherein the first set of solder balls surround the first package.

5. The method of claim 4, wherein at least one of the first set of solder balls has a first thickness measured in a first direction, the first direction being perpendicular to a major surface of the second package, the first package having a second thickness measured in the first direction, the second thickness being less than the first thickness.

6. The method of claim 1, wherein removing the first package comprises attaching a pick-and-place tool to the first package by a vacuum.

7. The method of claim 1, wherein the back-side redistribution structure is formed over a carrier substrate, wherein forming the second package further comprises:
 forming a first set of solder bumps on the front-side redistribution structure; and
 removing the second package from the carrier substrate.

8. The method of claim 7 further comprising:
 bonding a fifth package to the back-side redistribution structure of the second package using a second set of solder bumps.

9. The method of claim 7 further comprising:
 bonding a substrate to the second package using the first set of solder bumps.

10. A method comprising:
 forming under bump metallurgies (UBMs) on an interconnect structure of a second semiconductor package, the UBMs extending through a first dielectric layer of the interconnect structure to contact a first metallization pattern of the interconnect structure;
 forming micro bump pads on the interconnect structure of the second semiconductor package, the micro bump pads extending through the first dielectric layer of the interconnect structure to contact the first metallization pattern of the interconnect structure, wherein the UBMs have heights greater than heights of the micro bump pads, wherein the UBMs have widths greater than widths of the micro bump pads, and wherein bottommost surfaces of the UBMs are level with bottommost surfaces of the micro bump pads;
 forming a first set of conductive connectors contacting the UBMs using a solder-free material different from a material of the UBMs, the first set of conductive connectors having vertical sidewalls;
 forming metal cap layers over the first set of conductive connectors, the metal cap layers comprising a material different from the solder-free material and the material of the UBMs;

bonding a first semiconductor package to the micro bump pads using a plurality of solder joints, wherein the first semiconductor package has a height less than heights of the conductive connectors of the first set of conductive connectors;

directing a laser beam at the first semiconductor package to melt the solder joints, the solder joints bonding first contact pads of the first semiconductor package to the micro bump pads of the second semiconductor package;

removing the first semiconductor package using a first bond head;

after removing the first semiconductor package, removing at least a portion of solder from the micro bump pads;

after removing the first semiconductor package, testing the first semiconductor package;

when the testing the first semiconductor package results in the first package being functional, re-bonding the first semiconductor package to the micro bump pads;

when the testing the first semiconductor package results in the first package being non-functional, bonding a replacement semiconductor package to the micro bump pads; and after re-bonding the first semiconductor package or bonding the replacement semiconductor package, singulating the second semiconductor package from a third semiconductor package.

11. The method of claim 10 further comprising:
forming the second semiconductor package comprising:
  forming an electrical connector over a carrier substrate;
  attaching a first die to the carrier substrate, the electrical connector extending from a second side of the first die to a first side of the first die, the second side being opposite the first side, the electrical connector being adjacent the first die;
  encapsulating the first die and the electrical connector with a molding compound;
  forming the interconnect structure proximate the first side of the first die and the molding compound; and
  removing the second semiconductor package from the carrier substrate.

12. The method of claim 11 further comprising:
bonding a fourth semiconductor package to the second semiconductor package using a first set of solder bumps, the fourth semiconductor package being proximate the second side of the first die.

13. The method of claim 12 further comprising:
bonding a substrate to the second semiconductor package using the first set of conductive connectors.

14. The method of claim 12, wherein the fourth semiconductor package comprises a second die.

15. A method comprising:
forming a first package comprising:
  forming an electrical connector over a carrier substrate;
  attaching a first die to the carrier substrate, the electrical connector being adjacent the first die, a back-side redistribution structure being disposed between the first die and the carrier substrate, wherein the first die is attached to the carrier substrate by attaching the first die to the back-side redistribution structure using an adhesive;
  encapsulating the first die and the electrical connector with a molding compound, wherein a bottommost surface of the adhesive is level with a bottommost surface of the molding compound, wherein the bottommost surface of the adhesive and the bottommost surface of the molding compound contact a topmost surface of the back-side redistribution structure, wherein a bottommost surface of the electrical connector extends below the topmost surface of the back-side redistribution structure, and wherein a topmost surface of the molding compound is level with a topmost surface of the first die and a topmost surface of the electrical connector; and
  forming an interconnect structure proximate the topmost surfaces of the first die and the molding compound, the interconnect structure comprising a set of under bump metallurgies (UMBs);

forming a first set of conductive connectors on the UBMs of the interconnect structure, the first set of conductive connectors comprising a solder-free material different from a material of the UBMs, the first set of conductive connectors having vertical sidewalls;

forming a first set of metal cap layers on top of the first set of conductive connectors, the first set of metal cap layers comprising a conductive material different from the solder-free material of the first set of conductive connectors;

bonding a first surface of a second package to the interconnect structure with a first set of solder joints, wherein a topmost surface of the second package opposite the first surface is disposed below topmost surfaces of the conductive connectors of the first set of conductive connectors;

testing the second package for defects;

indirectly heating the first set of solder joints through the second package by performing a local heating process on a second surface of the second package based on the testing the second package for defects, the second surface of the second package being opposite the first surface of the second package;

removing the heated second package based on the testing the second package for defects;

if the second package is removed, re-bonding the second package to the interconnect structure;

after testing the second package for defects, removing the first package from the carrier substrate; and after removing the first package from the carrier substrate, singulating the first package.

16. The method of claim 15 further comprising:
bonding a fourth package to the first package using a second set of conductive connectors, the fourth package being proximate the second side of the first die, the fourth package being bonded to the back-side redistribution structure, the fourth package being coupled to the electrical connector through the back-side redistribution structure.

17. The method of claim 16 further comprising:
bonding a substrate to the first package using the first set of conductive connectors, the second package or the third package being interposed between the first package and the substrate.

18. The method of claim 15, wherein heating the first set of solder joints and the second package by directing a laser beam at a surface of the second package based on testing the second package for defects further comprises:
when the testing the second package for defects results in the second package not having defects, not heating the first set of solder joints and the second package; and
when the testing the second package for defects results in the second package having defects, heating the first set of solder joints and the second package by directing a laser beam at the surface of the second package.

19. The method of claim 4, wherein the first set of solder balls comprises a first solder ball and a second solder ball, the first solder ball being nearer to the first package than the second solder ball, and wherein heating the first set of solder joints heats the first solder ball without heating the second solder ball.

20. The method of claim 10, wherein the first set of conductive connectors comprises a first conductive connector and a second conductive connector, the first conductive connector being nearer to the first semiconductor package than the second conductive connector, and wherein the directing the laser beam at the first semiconductor package heats the first conductive connector such that the first conductive connector has a thicker intermetallic compound layer than the second conductive connector.

* * * * *